(12) United States Patent
Tamada et al.

(10) Patent No.: US 9,604,391 B2
(45) Date of Patent: Mar. 28, 2017

(54) LAMINATE, PRODUCTION METHOD FOR SAME, AND METHOD OF CREATING DEVICE STRUCTURE USING LAMINATE

(75) Inventors: Masahiro Tamada, Otsu (JP); Toshiyuki Tsuchiya, Otsu (JP); Tetsuo Okuyama, Otsu (JP); Kazuyuki Ouya, Otsu (JP); Satoshi Maeda, Otsu (JP)

(73) Assignee: Toyobo Co., Ltd., Osaka (JP)

( * ) Notice: Subject to any disclaimer, the term of this patent is extended or adjusted under 35 U.S.C. 154(b) by 608 days.

(21) Appl. No.: 14/111,374

(22) PCT Filed: Apr. 13, 2012

(86) PCT No.: PCT/JP2012/060141
§ 371 (c)(1),
(2), (4) Date: Oct. 11, 2013

(87) PCT Pub. No.: WO2012/141293
PCT Pub. Date: Oct. 18, 2012

(65) Prior Publication Data
US 2014/0042662 A1    Feb. 13, 2014

(30) Foreign Application Priority Data

Apr. 15, 2011 (JP) ................................ 2011-091041
May 30, 2011 (JP) ................................ 2011-120413

(Continued)

(51) Int. Cl.
*B29C 33/38* (2006.01)
*B32B 38/10* (2006.01)
(Continued)

(52) U.S. Cl.
CPC .......... *B29C 33/3842* (2013.01); *B29C 39/02* (2013.01); *B32B 38/10* (2013.01);
(Continued)

(58) Field of Classification Search
CPC ............ B29C 2033/385; B29C 47/068; H01L 21/02118
See application file for complete search history.

(56) References Cited

U.S. PATENT DOCUMENTS 5,601,905 A * 2/1997 Watanabe .............. G03F 7/094
428/213
5,670,262 A    9/1997 Dalman
(Continued)

FOREIGN PATENT DOCUMENTS

JP    H05-171458 A    7/1993
JP    H06-569992 A    3/1994
(Continued)

OTHER PUBLICATIONS

Japanese Patent Office, International Search Report in International Patent Application No. PCT/JP2012/060141 (Sep. 11, 2012).

*Primary Examiner* — Stella Yi
(74) *Attorney, Agent, or Firm* — Leydig, Voit & Mayer, Ltd.

(57) ABSTRACT

The invention provides a laminate of an inorganic layer, a resin layer, and a coupling agent treatment layer interposed therebetween, which different delamination strengths between the inorganic layer and the resin layer to form a prescribed pattern. The invention also provides a production method comprising (1) treating an inorganic layer with a coupling agent; (2) performing a patterning process to form strong adhesion sections and easily separated sections; and (3) forming a resin layer by drying and heat-treating a coated solution layer obtained by coating a resin solution or a resin precursor solution onto the surface of the inorganic layer that was treated with a coupling agent and then patterned.

9 Claims, 5 Drawing Sheets

(30) Foreign Application Priority Data

| | | |
|---|---|---|
| Jul. 27, 2011 | (JP) | 2011-164326 |
| Feb. 29, 2012 | (JP) | 2012-042961 |
| Mar. 22, 2012 | (JP) | 2012-065306 |

(51) Int. Cl.

| | |
|---|---|
| *B29C 39/02* | (2006.01) |
| *H01L 21/02* | (2006.01) |
| *B81C 1/00* | (2006.01) |
| *H01L 31/0392* | (2006.01) |
| *B32B 38/00* | (2006.01) |
| *H01L 27/12* | (2006.01) |

(52) U.S. Cl.
CPC ...... *B81C 1/0038* (2013.01); *H01L 21/02118* (2013.01); *H01L 21/02282* (2013.01); *H01L 31/0392* (2013.01); *H01L 31/03923* (2013.01); *H01L 31/03925* (2013.01); *B32B 38/0008* (2013.01); *B32B 2379/08* (2013.01); *H01L 27/1218* (2013.01); *Y02E 10/50* (2013.01)

(56) References Cited

U.S. PATENT DOCUMENTS

| | | |
|---|---|---|
| 5,741,585 A | 4/1998 | Harris et al. |
| 5,985,969 A | 11/1999 | Harris et al. |
| 2008/0038528 A1* | 2/2008 | Paul ............ C09J 107/00 428/219 |

FOREIGN PATENT DOCUMENTS

| | | |
|---|---|---|
| JP | H11-504369 A | 4/1999 |
| JP | H11-505184 A | 5/1999 |
| JP | 2006-245303 A | 9/2006 |
| JP | 2006-352156 A | 12/2006 |
| JP | 2008-019348 A | 1/2008 |
| JP | 2008-159935 A | 7/2008 |
| JP | 2009-246212 A | 10/2009 |
| JP | 2009-260387 A | 11/2009 |
| JP | 2010-283262 A | 12/2010 |
| JP | 2011-011455 A | 1/2011 |
| WO | 2010-071145 A | 6/2010 |

* cited by examiner (1)

(2)

(3)

(4)

(5)

(6)

(1)

(2)

LAMINATE, PRODUCTION METHOD FOR SAME, AND METHOD OF CREATING DEVICE STRUCTURE USING LAMINATE

CROSS-REFERENCE TO RELATED APPLICATIONS

This patent application is the U.S. national phase of International Patent Application No. PCT/JP2012/060141, filed Apr. 13, 2012, which claims the benefit of Japanese Patent Application No. 2011-091041, filed on Apr. 15, 2011, Japanese Patent Application No. 2011-120413, filed on May 30, 2011, Japanese Patent Application No. 2011-164326, filed on Jul. 27, 2011, Japanese Patent Application No. 2012-042961, filed on Feb. 29, 2012, and Japanese Patent Application No. 2012-065306, filed on Mar. 22, 2012, which are incorporated by reference in their entireties herein.

TECHNICAL FIELD

The present invention relates to a method for producing a laminate constituted of a resin layer and an inorganic layer, and more specifically relates to a method for producing the laminate having strongly adhering parts and easily peeling parts in a previously determined pattern. Furthermore specifically, the present invention relates to a method for laminating a laminate obtained by temporarily or semipermanently laminating a polyimide layer on an inorganic basal plate, and the laminate is useful at the time of forming a device such as a semiconductor device or a MEMS device, which is made of a thin film and requires fine processing, on the resin layer surface.

Further, the laminate of the present invention is a laminate obtained by laminating a thin resin layer excellent in heat resistance and insulation properties and an inorganic layer selected from a glass plate, a ceramic plate, a silicon wafer and metals and having a coefficient of thermal expansion which is substantially the same as that of the resin layer, the laminate being usable for mounting a very fine circuit thereon, and being excellent in dimensional stability as well as heat resistance and insulation properties. The present invention relates to such a laminate, a method for producing the same, and a device structure using the laminate.

BACKGROUND ART

In recent years, aiming to make functional devices such as a sensor device, a MEMS device, and a display device, lightweight, compact and thin, and flexible, techniques for forming these devices on a polymer film have actively been developed. For example, as a material for a base of electronic parts such as information and communication equipments (broadcast equipment, mobile radio equipment, portable communication equipment, etc.), radars, and high speed information processing equipments, ceramics having heat resistance and being capable of dealing with high frequency in a signal band (reaching GHz band) for information and communication equipments have conventionally been used; however, ceramics are not flexible, hard to be made thin, and therefore there is a disadvantage that the fields for which ceramics are applicable are limited.

In the case of forming a functional device such as a semiconductor device, a sensor device, a MEMS device, or a display device on a resin film surface, it is supposed to be ideal that the processing utilizing flexibility, a characteristic of a resin film, so-called roll-to-roll processing is employed for the processing. However, in semiconductor industries, sensor industries, MEMS industries, and display industries, processing techniques for rigid flat basal plates such as a wafer base and a glass substrate base have been established. As a realistic selection, it is supposed to be possible that a resin film is stuck to a rigid substrate made of an inorganic substance, for example, a metal plate, or a wafer, a glass plate; a desired device is formed; and thereafter, the resin film is peeled from the substrate; and thereby a functional device formed on the resin film is obtained by utilizing existing infrastructure.

Conventionally, it has been widely carried out that a polymer film is stuck to a substrate made of an inorganic substance by using a pressure-sensitive adhesive or an adhesive (Patent Document 1). However, in the case of forming a desired functional device on a laminate formed by sticking a resin film and a substrate made of an inorganic substance, the laminate is required to have surface smoothness, dimensional stability, cleanness, durability to processing temperature, resistance to chemical solution to be used for fine processing, etc., high enough to carry out the formation of the functional device. Particularly, in the case where the formation temperature of a functional device such as polysilicon and oxide semiconductors is high, processing in a temperature range of about 200 to 500° C. is required. For example, in fabrication of a low temperature polysilicon thin film transistor, heating treatment at 450° C. for about 2 hours for dehydrogenation is may be required and in formation of a hydrogenated amorphous silicon thin film, it may be possible that the film is exposed to a temperature of about 200° C. to 300° C., In the case where the functional device formation temperature is as high as described above, not only the resin film is required to have high heat resistance but also the bonding surface between the resin film and the substrate (that is, an adhesive or a pressure-sensitive adhesive for bonding) needs to withstand the processing temperature. However, since conventional adhesives and pressure-sensitive adhesives for bonding do not have sufficient heat resistance, they are not currently applicable in the case where the functional device formation temperature is high.

Further, among semiconductor thin films, Si has a very low coefficient of thermal expansion as about 3 ppm/° C. In forming a Si thin film on a resin film, if the difference between the coefficient of thermal expansion of the film and that of the thin film is high, the stress is accumulated in the thin film and it results in problems of causing deterioration in performance, warping and peeling of thin film. Particularly, in the case where high temperature is applied during the thin film formation process, the stress attributed to the difference between the coefficient of thermal expansion of the film and that of the thin film becomes significant during temperature change.

As the polymer film to be stuck to the substrate made of an inorganic substance, films with a low melting point is not suitable in terms of heat resistance, and resin films made of polyethylene naphthalate, polyethylene terephthalate, polyimide, and polytetrafluoroethylene, glass fiber-reinforced epoxy are used. A film made of a polyimide is provided with advantages such that the film is excellent in heat resistance, is also tough, and therefore is capable of being formed into a thin resin film. However, a polyimide film layer generally has a high coefficient of thermal expansion, shows considerable dimensional change owing to temperature change, and thus has a problem that it is difficult to use the film for producing a circuit having fine wiring, etc., and is limited in the fields of using the film. Accordingly, a device using a polyimide layer with sufficient physical properties as a basal plate provided with heat resistance, high mechanical physical properties, and flexibility has not been obtained yet.

As a polyimide film layer with high tensile elasticity, a polyimide-benzoxazole film made of a polyimide having a benzoxazole ring in the main chain has been proposed (see Patent Document 2). A printed circuit board having this polyimide-benzoxazole film as a dielectric layer has been also proposed (see Patent Document 3 and Patent Document 4). These polyimide-benzoxazole films made of a polyimide having a benzoxazole ring in the main chain is made to have improved tensile strength at break and tensile elasticity, and further a coefficient of thermal expansion in a satisfactory range; however, contrarily to the excellent mechanical properties, it becomes difficult to handle the film as the film is made thinner, and the film has a problem that the mechanical and dynamic properties are insufficient, etc.

It has also been tried to form other structurally-reinforced materials by forming an adhesive layer such as a thermoplastic resin on the polyimide film. However, although providing satisfactory improvement of structure, the trial tends to sacrifice the valuable heat resistance of the polyimide film because of the low heat resistance of the thermoplastic resin or the like. Moreover, a thermoplastic resin generally has a high coefficient of thermal expansion and thinning of this layer is limited so that the thermoplastic resin tends to cause an adverse effect on the dimensional stability at the time of heating.

On the other hand, as a flexible display apparatus using a resin basal plate, there is disclosed fabrication of a flexible display apparatus using a resin basal plate, the fabrication including the steps of: forming the resin basal plate on a fixed basal plate with an amorphous silicon film as a release layer interposed therebetween; forming at least a TFT device on the resin basal plate; and peeling the resin basal plate from the fixed basal plate through the amorphous silicon film by irradiating the amorphous silicon film with laser beams (Patent Document 5). However, at the time of peeling, laser irradiation or etching means needs to be used to the adhesive layer, and the steps are thus complicated, resulting in high cost. It is known that adhesion of resin films is performed by UV irradiation, and disclosed that use of a coupling agent at this time is effective (Patent Document 6). However, this technique persistently relates to adhesion of resin films, but do not relate to control of the adhesion peel force of the coupling agent itself by UV irradiation.

PRIOR ART DOCUMENT

Patent Documents

Patent Document 1: JP-A-2008-159935
Patent Document 2: JP-A-06-056992
Patent Document 3: JP-T-11-504369
Patent Document 4: JP-T-11-505184
Patent Document 5: JP-A-2009-260387
Patent Document 6: JP-A-2008-19348

SUMMARY OF THE INVENTION

Problems to be Solved by the Invention

The present invention has been made focusing on the above-mentioned circumstances, and an object thereof is to provide a laminate of a resin layer serving as a base for laminating a variety of devices, and an inorganic layer, wherein the laminate is not peeled even in high temperature process during device fabrication, and further the resin layer can be easily peeled from the inorganic layer after a device has been fabricated on the polyimide layer.

Solutions to the Problems

The present inventors have made intensive investigations, and consequently have found that at least one of surfaces of an inorganic basal plate is subjected to a coupling agent treatment, and then patterning for forming good adhesion parts and easily peeling parts with different adhesion peel strength and substantially the same surface roughness is carried out to form a resin layer on the patterned surface, thereby sticking the inorganic layer and the resin layer so that adhesion peel strength so sufficient as to cause no peeling even in high temperature process at the time of fabricating devices in the good adhesion part is exhibited, and a device-bearing resin film can be easily peeled from the support by forming a notch in the easily peeling part after device fabrication; and further heat resistance can be further improved and warp and deformation of a laminate can be advantageously suppressed since the dimensional stability of a polyimide layer can be similar to that of the support by using polyimide with specified composition as the resin layer, and therefore the present invention has been completed.

That is, the present invention includes the following configurations.

1. A method for producing a laminate composed of at least an inorganic layer and a resin layer, the method comprising the following steps (1) to (3) of:

(1) subjecting at least one surface of the inorganic layer to coupling agent treatment;

(2) carrying out patterning treatment for forming good adhesion parts and easily peeling parts with different adhesion peel strength between the inorganic layer and the resin layer and substantially the same surface roughness in at least one surface of the inorganic layer subjected to the coupling agent treatment in the step (1); and (3) forming the resin layer by applying a resin solution or a resin precursor solution to the coupling agent-treated surface of the inorganic layer subjected to the patterning treatment in the step (2) and drying and heating the obtained application solution layer.

2. The method for producing a laminate according to the said 1., wherein the patterning treatment is carried out by subjecting a part of the coupling agent-treated layer to inactivation treatment to form a prescribed pattern.

3. The method for producing a laminate according to the said 2., wherein the inactivation treatment is at least one kind treatment selected from the group consisting of blast treatment, vacuum plasma treatment, atmospheric pressure plasma treatment, corona treatment, active radiation irradiation treatment, active gas treatment, and chemical solution treatment performed by covering or shielding a prescribed portion.

4. The method for producing a laminate according to the said 3., wherein the active radiation treatment is UV irradiation treatment.

5. The method for producing a laminate according to any one of the said 1. to 4., wherein the resin layer contains a polyimide obtained by reaction of aromatic diamines and aromatic tetracarboxylic acids.

6. The method for producing a laminate according to any one of the said 1. to 5., wherein the resin layer contains a polyimide obtained by reaction of aromatic diamines and aromatic tetracarboxylic acids; 70 mol % or more of the aromatic diamines are aromatic diamines selected from at least one kind of an aromatic diamine having a benzoxazole structure, an aromatic diamine having a diaminodiphenyl ether structure, and an aromatic diamine having a phenylenediamine structure; and 70 mol % or more of the aromatic tetracarboxylic acids are aromatic tetracarboxylic acids selected from at least one kind of pyromellitic acid dianhydride and biphenyltetracarboxylic acid dianhydride.

7. A laminate obtained by the production method according to any one of the said 1. to 6., the laminate comprising an inorganic layer, a resin layer, and a coupling agent treatment layer interposed therebetween, wherein delamination strength between the inorganic layer and the resin layer is different between good adhesion parts and easily peeling parts, forming a prescribed pattern.

8. The laminate according to the said 7., wherein the easily peeling part has a 180-degree peel strength between the inorganic layer and the resin layer of 1 N/cm or more in good adhesion part, and the 180-degree peel strength between the inorganic layer and the resin layer in the easily peeling part is 50% or lower of the 180-degree peel strength between the inorganic layer and the resin layer in the good adhesion part.

9. The laminate according to the said 7. or 8., wherein the resin layer has a thickness of 0.5 μm to 50 μm, and the resin layer has a coefficient of thermal expansion in the plane direction of −5 ppm/° C. to +35 ppm/° C.

10. A method for producing a structure having a device formed on the resin layer, the method comprising:
  using a laminate having an inorganic layer and a resin layer as set forth in any of the said 7. to 9.;
  forming a device on the resin layer of the laminate;
  making a cut in the resin layer at an easily peeling part of the laminate; and
  peeling the resin layer from the inorganic layer.

Effects of the Invention

The laminate obtained by the production method of the present invention is a laminate obtained by sticking one surface of an inorganic layer (a glass plate, a ceramic plate, a silicon wafer, a metal, etc.) and a resin layer through a coupling agent layer, the polyimide film surface are separated such as the good adhesion parts and the easily peeling parts different in adhesion peel strength between the inorganic layer and the resin layer in a previously determined pattern, and therefore it is made possible to easily obtain a device-bearing polyimide film by forming a notch in the resin film at the easily peeling part and peeling the resin film after a device is fabricated on the resin film.

According to the present invention, a circuit or the like can be formed on a thin resin layer having insulation properties, flexibility, as well as heat resistance. Further, at the time of fabricating an electronic device by mounting electronic parts, even in the case of a thin resin layer, the resin layer is laminated and fixed on an inorganic layer excellent in dimensional stability, and therefore highly precise positioning can be performed and multilayered thin film fabrication and circuit formation can be carried out. Further, the laminate is not peeled even if heat is applied during the process, and at the time of peeling from the inorganic basal plate based on the necessity after device fabrication, the peeling of the resin layer from the basal plate can be smoothly performed. Since the laminate is a laminate having peel strength enough to cause no peeling in the process transfer steps, conventional electronic device fabrication processes can be employed as they are.

In the case of solar cells using single crystalline and polycrystalline Si, etc., there are problems of easiness of cracking and durability after production completion while thinning of the cells proceeds, but these problems can be solved by using a polyimide layer used as a basal plate in the form of a laminate with an inorganic layer likewise the present invention. Further, there are parts which are peeled easily at that time, and therefore a reinforced basal plate from which electrodes can be drawn can be fabricated.

Figure 1:
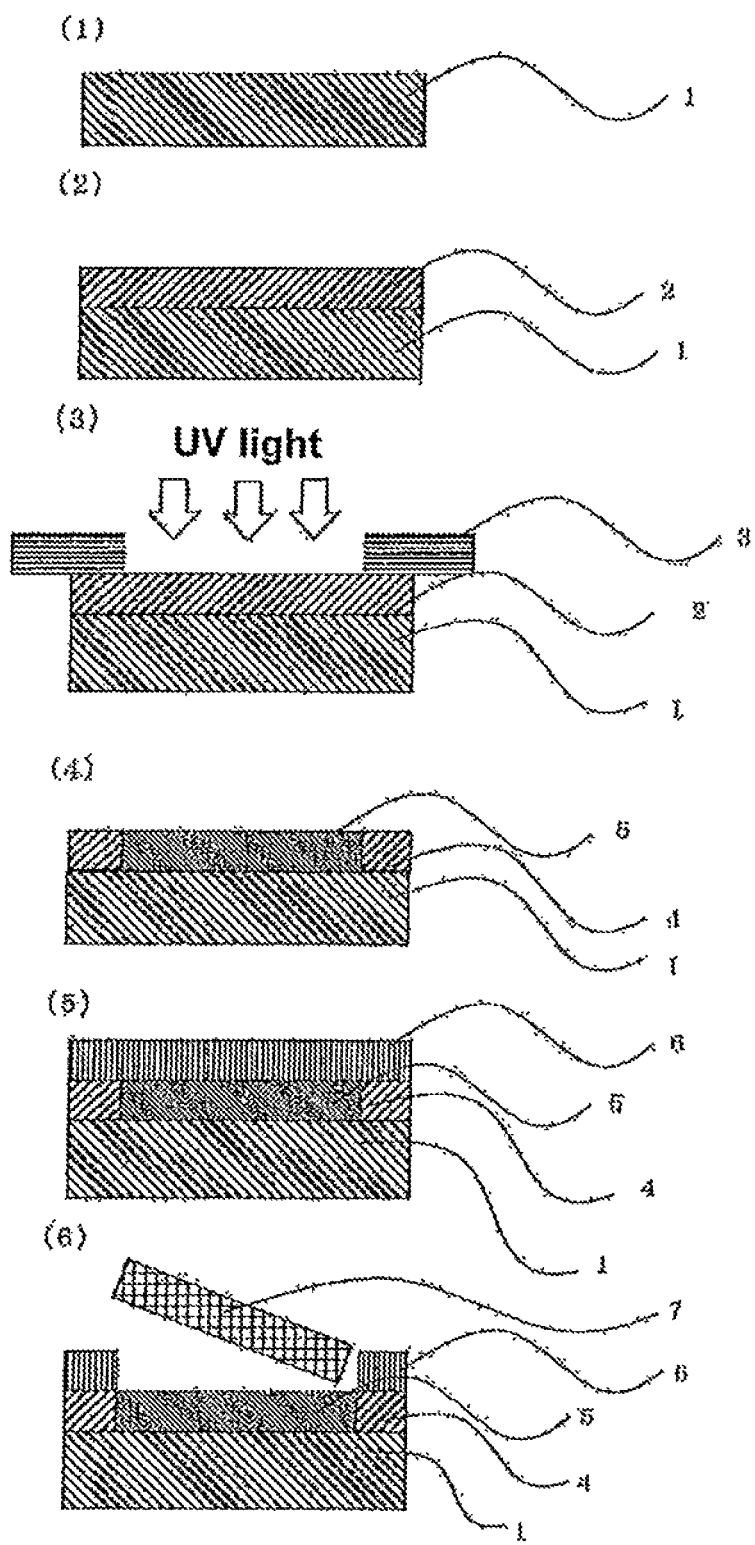
FIG. 1 UV Irradiation Step Example 1: (1) inorganic layer, (2) silane coupling agent layer formation by applying a silane coupling agent to the inorganic layer, followed by drying, (3) UV irradiation treatment after arranging a mask for shielding UV light, (4) removal of the mask for shielding UV light after UV irradiation treatment, (5) fabrication of a resin layer, and (6) cutting in the periphery of a UV irradiation treatment part in the silane coupling agent layer of the resin film and peeling of the resin film from glass.

MODE FOR CARRYING OUT THE INVENTION (Laminate)

The production method for a laminate of the present invention is a method for producing a laminate composed of at least an inorganic layer and a resin layer.

(Inorganic Layer)

The inorganic layer in the present invention may be a plate-like substrate which is made of an inorganic substance and usable as a basal plate, and examples thereof include plates mainly constituted of a glass plate, a ceramic plate, a silicon wafer, and a metal as well as composites obtained by laminating the glass plate, ceramic plate, silicon wafer, and metal, obtained by dispersing these materials, and obtained by adding fibers of these materials.

The glass plate includes quartz glass, high silicate glass (96% silica), soda-lime glass, lead glass, aluminoborosilicate glass, borosilicate glass (Pyrex (registered trademark)), borosilicate glass (alkali-free), borosilicate glass (microsheet), aluminosilicate glass, etc. Above all, those having a coefficient of thermal expansion of 5 ppm/° C. or lower are desirable and examples thereof desirable as commercialized products are "Corning 7059", "Corning 1737", and "EAGLE" manufactured by Corning Incorporated, which are glasses for liquid crystal; "AN 100" manufactured by Asahi Glass Co., Ltd.; "OA10" manufactured by Nippon Electric Glass Co., Ltd.; "AF32" manufactured by SCHOTT; and the like.

The ceramic plate includes ceramics for basal plates such as $Al_2O_3$, mullite, AlN, SiC, $Si_3N_4$, BN, crystallized glass, cordierite, spodumene, Pb-BSG+$CaZrO_3$+$Al_2O_3$, crystallized glass+$Al_2O_3$, crystallized Ca-BSG, BSG+Quartz, BSG+Quartz, BSG+$Al_2O_3$, Pb+BSG+$Al_2O_3$, glass-ceramic, and Zerodur; capacitor materials such as $TiO_2$, strontium titanate, calcium titanate, magnesium titanate, alumina, MgO, steatite, $BaTi_4O_9$, $BaTiO_3$, $BaTi_4$+$CaZrO_3$, BaSrCa-$ZrTiO_3$, $Ba(TiZr)O_3$, PMN-PT, and PFN-PFW; piezoelectric materials such as $PbNb_2O_6$, $Pb_{0.5}Be_{0.5}Nb_2O_6$, $PbTiO_3$, $BaTiO_3$, PZT, 0.855PZT-95PT-0.5BT, 0.873PZT-0.97PT-0.3BT, and PLZT; and the like.

The silicon wafer includes all of n-type and p-type doped silicon wafers, intrinsic silicon wafers, etc., and also includes silicon wafers obtained by depositing a silicon oxide layer and a variety of thin films on silicon wafers, and besides a silicon wafer, germanium, silicon-germanium, gallium-arsenic, aluminum-gallium-indium, nitrogen-phosphorus-arsenic-antimony are well employed. Further, widely-used semiconductor wafers such as InP (indium-phosphorus), InGaAs, GaInNAs, LT, LN, ZnO (zinc oxide), CdTe (cadmium-tellurium), and ZnSe (zinc selenide) are also included.

The metal includes single metals such as W, Mo, Pt, Fe, Ni, and Au; and alloys such as Inconel, Monel, Nimonic, carbon copper, Fe—Ni-based invar alloy, and super-invar alloy. Further, multilayer metal plates obtained by adding other metal layers or ceramic layers to these metals are also included. In this case, if CTE of the entire body with the added layers is low, Cu, Al and the like may be used for the main metal layer. A metal to be used for an added metal layer is not particularly limited if the metal has properties such that the adhesion to the polyimide film is reinforced, no dispersion is caused and chemical resistance or heat resistance is excellent, but preferable examples thereof include chromium, nickel, TiN, and Mo-containing Cu.

The plane part of the inorganic layer is desirably sufficient flat. Concretely, the surface roughness has a P-V value of 50 nm or lower, more preferably 20 nm or lower, and furthermore preferably 5 nm or lower. If the surface roughness is rougher than the above range, the peel strength of the polyimide layer and the inorganic layer may possibly become insufficient.

(Resin Layer)

The resin layer in the present invention is preferably a resin layer constituted of a heat resistant resin such as polyethylene terephthalate, polybutylene terephthalate, polyethylene naphthalate, fully aromatic polyester, epoxy resin having a mesogen skeleton, polyacetal, polycarbonate, polyphenylene ether, polysulfone, polyether sulfone, fluoro resin, polybenzoxazole, polybenzimidazole, polybenzothiazole, polyimide, aromatic polyamide imide, aromatic polyether ether ketone, aromatic polyether ketone ketone, polyphenylene sulfide, and aromatic polyarylate. The resin materials excellent in heat resistance and tough as described above can be employed, and among them, a resin layer constituted of a polyimide is more preferable. It is furthermore preferable that the resin materials have an aromatic ring and a group such as —CONH—, —COO—, —CO—, and —SO— as a bonding group with high polarity since high heat resistance and dimensional stability are required. It is still more preferable that the resin materials have a rigid rod-like structure by introducing a double chain structure in the polymer main chain from the viewpoint of heat resistance and dimensional stability. As another way of thinking, possession of a three-dimensional net structure can be means for improving heat resistance.

(Polyamide Acid)

The polyamide acid which is a precursor of the polyimide in the present invention is a polyamide acid obtained by reaction of aromatic diamines and aromatic tetracarboxylic acids, and is a precursor of the polyimide. The polyamide acid can be obtained by allowing aromatic diamines and aromatic tetracarboxylic acids to react in a solvent.

(Aromatic Diamines)

It is important that the aromatic diamines constituting the polyamide acid are aromatic diamines selected from at least one of aromatic diamines having a benzoxazole structure, aromatic diamines having a 4,4'-diaminodiphenyl ether structure, and aromatic diamines having a p-phenylenediamine structure in an amount of 70 mol % or more (that is, 70 mol % or more of fully aromatic diamines). Use of a prescribed amount of the diamines makes it possible to obtain a polyimide layer in which rigid molecules are highly oriented and which has high elastic modulus, low heat shrinkage, low linear expansion coefficient, and high heat resistance. It is preferable to use aromatic diamines having a benzoxazole structure among the above-mentioned diamines.

The content of at least one of aromatic diamines having a benzoxazole structure, aromatic diamines having a 4,4'-diaminodiphenyl ether structure, and aromatic diamines having a p-phenylenediamine structure is preferably 80 mol % or more, and more preferably 90 mol % or more in the aromatic diamines.

The molecular structure of the aromatic diamines having a benzoxazole structure is not particularly limited, and concrete examples thereof include followings. The aromatic diamines having a benzoxazole structure may be used alone or two or more thereof may be used in combination.

5-amino-2-(p-aminophenyl)benzoxazole,
6-amino-2-(p-aminophenyl)benzoxazole,
5-amino-2-(m-aminophenyl)benzoxazole,
6-amino-2-(m-aminophenyl)benzoxazole,
2,2'-p-phenylenebis(5-aminobenzoxazole),
2,2'-p-phenylenebis(6-aminobenzoxazole),
1-(5-aminobenzoxazolo)-4-(6-aminobenzoxazolo)benzene,
2,6-(4,4'-diaminodiphenyl)benzo[1,2-d:5,4-d']bisoxazole,
2,6-(4,4'-diaminodiphenyl)benzo[1,2-d:4,5-d']bisoxazole,
2,6-(3,4'-diaminophenyl)benzo[1,2-d:5,4-d']bisoxazole,
2,6-(3,4'-diaminophenyl)benzo[1,2-d:4,5-d']bisoxazole,
2,6-(3,3'-diaminophenyl)benzo[1,2-d:5,4-d']bisoxazole,
2,6-(3,3'-diaminophenyl)benzo[1,2-d:4,5-d']bisoxazole.

Among them, in terms of easiness for synthesis, the respective isomers of amino(aminophenyl)benzoxazole are preferable and 5-amino-2-(p-aminophenyl)benzoxazole is more preferable. Herein, the "respective isomers" means respective isomers defined in accordance with the chelation sites of two amino groups contained in amino(aminophenyl)benzoxazole.

Examples of the aromatic diamines having a diaminodiphenyl ether structure include 4,4'-diaminodiphenyl ether (4,4'-oxydianiline), 3,3'-diaminodiphenyl ether, and 3,4'-diaminodiphenyl ether; and 4,4'-diaminodiphenyl ether is particularly preferable.

Examples of the aromatic diamines having a phenylenediamine include p-phenylenediamine (1,4-diaminobenzene), m-phenylenediamine, and o-phenylenediamine; and p-phenylenediamine is particularly preferable.

One or more of the following diamines may be used in combination if the content thereof is 30 mol % or lower in all diamines in the present invention. Examples of the such diamines include 4,4'-bis(3-aminophenoxy)biphenyl, bis[4-(3-aminophenoxy)phenyl]ketone, bis[4-(3-aminophenoxy)

phenyl]sulfide, bis[4-(3-aminophenoxy)phenyl]sulfone, 2,2-bis[4-(3-aminophenoxy)phenyl]propane, 2,2-bis[4-(3-aminophenoxy)phenyl]-1,1,1,3,3,3-hexafluoropropane, m-aminobenzylamine, p-aminobenzylamine, 3,3'-diaminodiphenyl sulfide, 3,3'-diaminodiphenyl sulfoxide, 3,4'-diaminodiphenyl sulfoxide, 4,4'-diaminodiphenyl sulfoxide, 3,3'-diaminodiphenyl sulfone, 3,4'-diaminodiphenyl sulfone, 4,4'-diaminodiphenyl sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxy)phenyl]methane, 1,1-bis[4-(4-aminophenoxy)phenyl]ethane, 1,2-bis[4-(4-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5-dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-(4-aminophenoxy)phenyl]sulfone, bis[4-(3-aminophenoxy)phenyl]ether, bis[4-(4-aminophenoxy)phenyl]ether, 1,3-bis[4-(4-aminophenoxy)benzoyl]benzene, 1,3-bis[4-(3-aminophenoxy)benzoyl]benzene, 1,4-bis[4-(3-aminophenoxy)benzoyl]benzene, 4,4'-bis[(3-aminophenoxy)benzoyl]benzene, 1,1-bis[4-(3-aminophenoxy)phenyl]propane, 1,3-bis[4-(3-aminophenoxy)phenyl]propane, 3,4'-diaminodiphenyl sulfide, 2,2-bis[3-(3-aminophenoxy)phenyl]-1,1,1,3,3,3-hexafluoropropane, bis[4-(3-aminophenoxy)phenyl]methane, 1,1-bis[4-(3-aminophenoxy)phenyl]ethane, 1,2-bis[4-(3-aminophenoxy)phenyl]ethane, bis[4-(3-aminophenoxy)phenyl]sulfoxide, 4,4'-bis[3-(3-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxy)phenoxy}phenyl]sulfone, 1,4-bis[4-(4-aminophenoxy)phenoxy-α,α-dimethylbenzyl]benzene, 1,3-bis[4-(4-aminophenoxy)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenone, 4,4'-diamino-5,5'-diphenoxybenzophenone, 3,4'-diamino-4,5'-diphenoxybenzophenone, 3,3'-diamino-4-phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-dibiphenoxybenzophenone, 4,4'-diamino-5,5'-dibiphenoxybenzophenone, 3,4'-diamino-4,5'-dibiphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, 2,6-bis[4-(4-amino-α,α-dimethylbenzyl)phenoxy]benzonitrile, 2,2'-bis(biphenyl)benzidine, and aromatic diamines formed by substituting part or all of hydrogen atoms on the aromatic rings of the aromatic diamines with halogen atoms, alkyl groups or alkoxyl groups having 1 to 3 carbon atoms, cyano groups, and halo-alkyl groups or halo-alkoxy groups having 1 to 3 carbon atoms, which are formed by substituting part or all of hydrogen atoms of alkyl groups or alkoxy groups with halogen atoms.

<Aromatic Tetracarboxylic Acids>

An aromatic tetracarboxylic acids constituting the polyamide acid are not particularly limited, and aromatic tetracarboxylic acids or acid anhydrides thereof, which are commonly used for polyimide synthesis can be used. In the case where the aromatic tetracarboxylic acids is acid anhydrides, those having one or two anhydride structures in the molecule may be used, and those having two anhydride structures (dianhydrides) in the molecule are preferable. The aromatic tetracarboxylic acids may be used alone or two or more thereof may be used in combination.

Concrete examples of the aromatic tetracarboxylic acids to be used in the present invention include followings. The tetracarboxylic acid dianhydrides may be used alone or two or more thereof may be used in combination. Among them, it is preferable to contain any one of pyromellitic acid dianhydride and biphenyltetracarboxylic acid dianhydride in an amount of 70 mol % or more in all aromatic tetracarboxylic acids.

pyromellitic acid dianhydride, 3,3',4,4'-biphenyltetracarboxylic acid dianhydride, 4,4'-oxydiphthalic acid dianhydride, 3,3',4,4'-benzophenonetetracarboxylic acid dianhydride, 3,3',4,4'-diphenylsulfonetetracarboxylic acid dianhydride, 2,2-bis[4-(3,4-dicarboxyphenoxy)phenyl]propanoic acid dianhydride.

Aromatic tetracarboxylic acid dianhydrides obtained by substituting some or all of hydrogen atoms in the aromatic rings of the aromatic tetracarboxylic acid dianhydrides with phenyl group, biphenyl group, naphthyl group, and the like; etc., may be also used.

In the present invention, it is particularly preferable to use a polyimide obtained by combinations of aromatic tetracarboxylic acids having skeletons of pyromellitic acid anhydride and biphenyltetracarboxylic acid dianhydride with aromatic diamines having a benzoxazole structure and aromatic diamines having a 4,4'-diaminodiphenyl ether skeleton. It is because, if a polyimide of the above-mentioned combination is used, a polyimide film with low warp from a polyimide laminate can be obtained. If a device is fabricated in an easily peeling part of the polyimide layer of the polyimide laminate, breakage of the device fabricated on the polyimide film surface is not observed at the time of peeling the polyimide film.

In the preferable composition, the content of biphenyltetracarboxylic acid is preferably 1 to 50 mol %, more preferably 5 to 30 mol %, and most preferably 10 to 20 mol % in all aromatic tetracarboxylic acids.

In the preferable composition, the content of 4,4'-diaminodiphenyl ether is preferably in a range of 1 to 60 mol %, more preferably 5 to 30 mol %, and most preferably 10 to 30 mol % in all aromatic diamines.

The solvent to be used at the time of obtaining a polyamide acid by reaction (polymerization) of the aromatic tetracarboxylic acids and the aromatic diamines is not particularly limited if it can dissolve all of monomers to be raw materials and the polyamide acid to be generated, but polar organic solvents are preferable and examples thereof include N-methyl-2-pyrrolidone, N-acetyl-2-pyrrolidone, N,N-dimethylformamide, N,N-diethylformamide, N,N-dimethylacetamide, dimethyl sulfoxide, hexamethylphosphoric amide, ethylcellosolve acetate, diethylene glycol dimethyl ether, sulfolane, halophenols, and the like. Such solvents may be used alone or in mixture. The use amount of these solvents may be an amount sufficient for solving monomers to be raw materials, and a concrete use amount includes an amount such that the weight amount of the monomers in the solution in which the monomers are dissolved is adjusted to generally 5 to 40 weight %, and preferably 10 to 30 weight %.

The conditions for polymerization reaction to obtain a polyamide acid (hereinafter, simply referred to as "polymerization reaction") may be conventionally known conditions and, for example, the conditions may be continuous stirring and/or mixing in a temperature range of 0 to 80° C. for 10 minutes to 120 hours. If necessary, the polymerization reaction may be dividedly carried out or the reaction temperature may be changed up and down. In this case, the addition order of the both monomers is not particularly limited, but it is preferable to add aromatic tetracarboxylic acids to a solution of aromatic diamines. The weight of the polyamide acid in the polyamide acid solution to be obtained by the polymerization reaction is preferably 5 to 40 weight %, and more preferably 10 to 30 weight %. From the viewpoint of ease of handling, the said solution has a viscosity of preferably 1 to 1000 Pa·s, and more preferably 3 to 600 Pa·s in measurement (25° C.) by Brookfield viscometer.

Vacuum defoaming during the polymerization reaction is effective to produce a high quality polyamide acid solution. Further, a terminal sealing agent such as dicarboxylic acid anhydride, tricarboxylic acid anhydride, or aniline derivative can be used for molecular terminal sealing in the present invention. Those preferably used in the present invention are phthalic anhydride, maleic anhydride, 4-ethynylphthalic anhydride, 4-phenylethynylphthalic anhydride, and ethynylaniline; and maleic anhydride is more preferably used. The use amount of the terminal sealing agent is 0.001 to 1.0 mol ratio to 1 mol of the monomer components.

In the present invention, for a purpose of improving the performance of the polyimide layer, additives such as a defoaming agent, a leveling agent, a flame retardant, a crosslinking agent, a thixotropic agent, and a dispersant may be added to the polyamide acid solution. Various additives are used in accordance with their purposes, and are not particularly limited. An addition method and addition timing are not also particularly limited.

In the present invention, in order to object of improvement of property of the polyimide layer, filler may be added to the polyamide acid solution. The filler in the present invention are fine particles made of an inorganic substance having a volume average particle diameter of 0.001 to 10 μm, and those usable are particles made of metals, metal oxides, metal nitrides, metal carbides, acid metal salts, phosphates, carbonates, talc, mica, clay, other clay minerals, or the like. Preferably, those usable are metal oxides, phosphates, and carbonates such as silicon oxide, calcium phosphate, calcium hydrogen phosphate, calcium dihydrogen phosphate, calcium pyrophosphate, hydroxyapatite, calcium carbonate, and glass filler.

(Coupling Agent)

The coupling agent in the present invention means a compound having an action of increasing the adhesive force between the inorganic layer and the resin layer with the coupling agent physically or chemically interposed therebetween, and generally includes compounds known as a silane-based coupling agent, a phosphorus-based coupling agent, a titanate-based coupling agent, and the like.

The coupling agent layer means a layer constituted mainly of a coupling agent, the layer being formed by the coupling agent treatment. The thickness of the coupling treatment layer is extremely thin as compared with that of the inorganic layer, polyimide layer in the present invention, or a common adhesive or pressure sensitive adhesive, and can be negligible from the viewpoint of mechanical designing, and may be sufficient theoretically to have a thickness of at least mono-molecular layer order. The thickness is preferably 0.1 nm to 500 nm, more preferably 0.3 nm to 250 nm, further preferably 1 nm to 100 nm, particularly preferably 1 nm to 50 nm, and most preferably 1 nm to 20 nm. In the process in which a coupling agent is desirably as low as possible, the thickness of 5 nm or thinner is also possible. However, if it is thinner than 1 nm, the peel strength is decreased or parts which does not partially adhere may possibly be formed, and therefore the thickness is preferably 1 nm or thicker.

The thickness of the coupling treatment layer can be measured by an ellipsometry method or by calculation from the concentration and application amount of the coupling agent solution at the time of application.

The coupling agent is not particularly limited, and a silane coupling agent having an amino group or an epoxy group is preferable. Preferable concrete examples of the silane coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, tris-(3-trimethoxysilylpropyl) isocyanurate, chloromethylphenethyltrimethoxysilane, chloromethyltrimethoxysilane, and the like.

Besides those described above, examples of the coupling agent to be used in the present invention may also include 1-mercapto-2-propanol, methyl 3-mercaptopropionate, 3-mercapto-2-butanol, butyl 3-mercaptopropionate, 3-(dimethoxymethylsilyl)-1-propanethiol, 4-(6-mercaptohexanoyl)benzyl alcohol, 11-amino-1-undecenethiol, 11-mercaptoundecylphosphonic acid, 11-mercaptoundecyltrifluoroacetic acid, 2,2'-(ethylenedioxy)diethanethiol, 11-mercaptoundecyltri(ethylene glycol), (1-mercaptoundec-11-yl) tetra(ethylene glycol), 1-(methylcarboxy)undec-11-yl)hexa(ethylene glycol), hydroxyundecyl disulfide, carboxyundecyl disulfide, hydroxyhexadodecyl disulfide, carboxyhexadecyl disulfide, tetrakis(2-ethylhexyloxy)titanium, titaniumdioctyloxy bis(octylene glycolate), zirconium tributoxymonoacetylacetonate, zirconium monobutoxyacetylacetonate bis(ethyl acetoacetate), zirconium tributoxymonostearate, acetoalkoxyaluminum diisopropylate, n-propyltrimethoxysilane, butyltrichlorosilane, 2-cyanoethyltriethoxysilane, cyclohexyltrichlorosilane, decyltrichlorosilane, diacetoxydimethylsilane, diethoxydimethylsilane, dimethoxydimethylsilane, dimethoxydiphenylsilane, dimethoxymethylphenylsilane, dodecyltrichlorosilane, dodecyltrimethoxysilane, ethyltrichlorosilane, hexyltrimethoxysilane, octadecyltriethoxysilane, octadecyltrimethoxysilane, n-octyltrichlorosilane, n-octyltriethoxysilane, n-octyltrimethoxysilane, triethoxyethylsilane, triethoxymethylsilane, trimethoxymethylsilane, trimethoxyphenylsilane, pentyltriethoxysilane, pentyltrichlorosilane, triacetoxymethylsilane, trichlorohexylsilane, trichloromethylsilane, trichlorooctadecylsilane, trichloropropylsilane, trichlorotetradecylsilane, trimethoxypropylsilane, allyltrichlorosilane, allyltriethoxysilane, allyltrimethoxysilane, diethoxymethylvinylsilane, dimethoxymethylvinylsilane, trichlorovinylsilane, triethoxyvinylsilane, vinyltris(2-methoxyethoxy)silane, trichloro-2-cyanoethylsilane, diethoxy(3-glycidyloxypropyl)methylsilane, 3-glycidyloxypropyl(dimethoxy)methylsilane, 3-glycidyloxypropyltrimethoxysilane, 2,3-butanedithiol, 1-butanethiol, 2-butanethiol, cyclohexanethiol, cyclopentanethiol, 1-decanethiol, 1-dodecanethiol, 2-ethylhexyl 3-mercaptopropionate, ethyl 3-mercaptopropionate, 1-heptanethiol, 1-hexadecanethiol, hexylmercaptan, isoamylmercaptan, isobutylmercaptan, 3-mercaptopropionic acid, 3-methoxybutyl 3-mercaptopropionate, 2-methyl-1-butanethiol, 1-octadecanethiol, 1-octanethiol, 1-pentadecanethiol, 1-pentanethiol, 1-propanethiol, 1-tetradecanethiol, 1-undecanethiol, 1-(12-mercaptododecyl)imidazole, 1-(11-mercaptoundecyl)imidazole, 1-(10-mercaptodecyl)imidazole, 1-(16-mercaptohexadecyl)imidazole, 1-(17-mercaptoheptadecyl)imidazole, 1-(15-mercapto)dodecanoic acid, 1-(11-mercapto)undecanoic acid, 1-(10-mercapto)decanoic acid, and the like.

Examples of the preferable coupling agent among the above include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, aminophenyltrimethoxysilane, aminophenethyltrimethoxysilane, aminophenyl aminomethyl phenethyltrimethoxysilane, and the like. In the case where particularly high heat resistance is required in process, those having Si and an amino group boned with an aromatic group are preferable.

(Coupling Agent Treatment)

The coupling agent treatment in the present invention is treatment for making a coupling agent exit in the surface of the inorganic layer, and those applicable as a method for forming a coupling treatment layer by carrying out the coupling agent treatment may be a method for applying and drying a coupling agent directly or while diluting the coupling agent with a solvent and carrying out heating treatment; a method for immersing the in organic layer in a coupling agent itself or in a solution obtained by diluting the coupling agent in a solvent and thereafter drying and carrying out heating treatment; a method for adding a coupling agent in a resin solution or a melted resin and carrying out the coupling agent treatment simultaneously with resin film production; and the like.

Those applicable as a method for applying a coupling agent or its diluted solution may be conventionally known methods. Further, applicable methods may be a method for depositing a coupling agent or its diluted solution to a transfer medium like a printing plate material such as a relief printing material or an intaglio printing material, or a "stamp", transferring the coupling agent or the solution thereto, and thereafter spreading the coupling agent or the solution to the entire surface by a spin coater; a method for printing a coupling agent or its diluted solution on the entire surface by ink-jetting; and a method using already-existing other printing means. The application amount (deposition amount or content) of the coupling agent may be set properly so that the coupling treatment layer to be formed has a thickness described below. The conditions at the time of heat treatment may be heating at a temperature of preferably 50 to 250° C., more preferably 75 to 165° C., and furthermore preferably about 95 to 155° C., and preferably for 30 seconds or longer, more preferably 2 minutes or longer, and furthermore preferably 5 minutes or longer. If the heating temperature is too high, the coupling agent may possibly be decomposed or inactivated, and if it is too low, fixation may possibly become insufficient. If the heating time is too long, similar problems may possibly be also caused, and the upper limit of the heating time is preferably 5 hours, and more preferably about 2 hours. At the time of carrying out the coupling agent treatment, it is known that pH during the treatment significantly affects the performance, and therefore it is desirable to properly adjust pH.

(Patterning Treatment)

The patterning treatment in the present invention means treatment for forming good adhesion parts and easily peeling parts with different adhesion strength between the inorganic layer and the polyimide layer and substantially the same surface roughness in the surface of the coupling agent treatment layer.

One example of the patterning treatment is for forming an aimed pattern of two regions for good adhesion parts with high adhesion peel strength and easily peeling parts with low adhesion peel strength in a coupling treatment layer formed by the coupling agent treatment with an extremely thin thickness as thin as several nm to several tens nm. The good adhesion parts and the easily peeling parts preferably have substantially the same surface roughness.

As means for patterning treatment, the patterning treatment is preferably carried out by forming a coupling treatment layer by coupling agent treatment, and then carrying out inactivation treatment or activation treatment partially for the coupling treatment layer to form a prescribed pattern. This makes it possible to form parts strong in peel strength (adhesion peel strength) and parts weak in peel strength intentionally between the support and the resin layer. In the present invention, it is more preferable to carry out inactivation treatment partially for the coupling treatment layer. The inactivation treatment for the coupling treatment layer includes physically removing partial coupling treatment layer (so-called etching); physically masking in micro-scale for the coupling treatment layer; and chemically denaturing the coupling treatment layer.

The fact that the surface roughness is substantially the same means that the average surface roughness (Ra1) of the good adhesion parts and the average surface roughness (Ra2) of the easily peeling parts satisfy the following formula (1).

$$|Ra1-Ra2| \div Ra1 \times 100 \leq 50 \quad (1)$$

As means for forming a prescribed pattern by carrying out inactivation treatment selectively for parts of the coupling treatment layer, parts of the coupling treatment layer corresponding to the prescribed pattern is temporarily coated or shielded with a mask, thereafter etching or the like is carried out on the entire surface, and then the mask is removed; or etching or the like may be carried out depending on the prescribed pattern by directly drawing manner, if possible. As the mask, those used generally as resist, a photomask, a metal mask, etc., may be properly selected and used depending on an etching method. As an etching technique, either wet etching using a chemical solution or dry etching using active gas or plasma may be employed.

Figure 3:
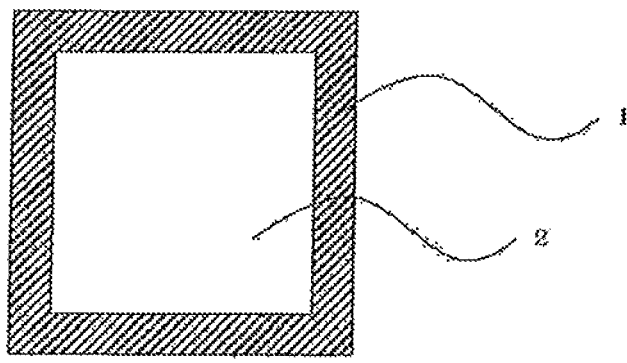
FIG. 3 Pattern example
Figure 3:
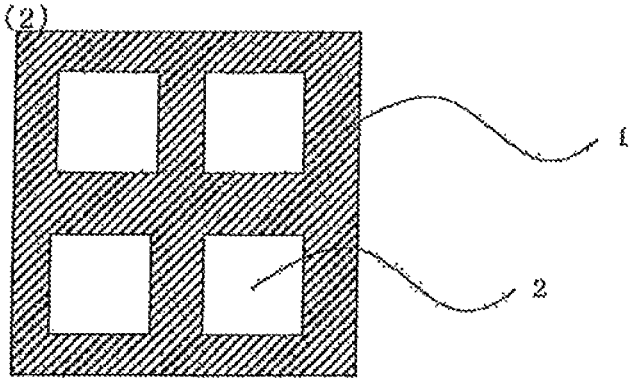
Figure 3:
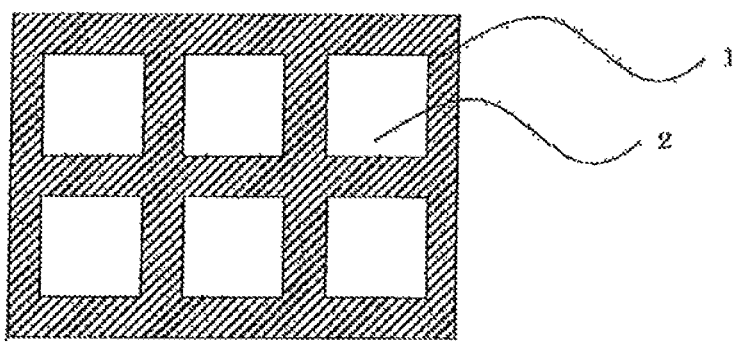

The pattern shape is not particularly limited, and may be set properly depending on the kinds of devices to be laminated. One example is as shown in FIG. 3, and includes, as shown in FIG. 3(1), a pattern in which a good adhesion part 10 is arranged only in the outer circumferential part of the laminate and an easily peeling part 20 is arranged in the inside of the laminate, or as shown in FIG. 3(2), a pattern in which a good adhesion part 10 is arranged linearly in both outer circumferential part and inside of the laminate.

The inactivation treatment may be apply at least one treatment selected from the group consisting of blast treatment, vacuum plasma treatment, atmospheric-pressure plasma treatment, corona treatment, active radiation irradiation treatment, active gas treatment, and chemical liquid treatment.

The blast treatment refers to treatment of blowing particles with an average particle diameter of 0.1 to 1000 μm together with a gas or a liquid to an object. In the present invention, blast treatment using particles with an average particle diameter as small as possible is preferably carried out.

The vacuum plasma treatment refers to treatment of exposing an object to plasma generated by electric discharge in a reduced pressure gas, or of allowing ions generated by the same electric discharge to collide with the object. Examples of the gas that can be used include neon, argon, nitrogen, oxygen, fluorocarbon, carbon dioxide, hydrogen and the like singly as well as a mixture gas.

The atmospheric-pressure plasma treatment refers to treatment of exposing an object to plasma generated by electric discharge in gas under approximately atmospheric pressure, or of allowing ions generated by the same electric discharge to collide with the object. Examples of the gas that can be used include neon, argon, nitrogen, oxygen, fluorocarbon, carbon dioxide, hydrogen and the like singly as well as a mixture gas.

The corona treatment refers to treatment of exposing an object to corona discharge atmosphere in gas under approximately atmospheric pressure, or of allowing ions generated by the same electric discharge to collide with the object.

The active radiation irradiation treatment refers to treatment of irradiating radiations such as electron beams, alpha rays, x-rays, beta rays, infrared rays, visible light, ultraviolet rays, and the like. In the case of carrying out laser beam irradiation treatment, particularly, it is easy to carry out the treatment in a direct drawing manner. In this case, even in the case of visible light laser, because of rather higher energy than common visible light, a visible light laser can be regarded as one of active radiations in the present invention.

The active gas treatment refers to treatment of exposing an object to a gas so active as to cause chemical or physical changes of the coupling agent treatment layer, such as a halogen gas, a hydrogen halide gas, ozone, high concentration oxygen gas, ammonia gas, an organic alkaline gas and an organic acidic gas.

The chemical liquid treatment refers to treatment of exposing an object to a liquid or solution so active as to cause chemical or physical changes of the coupling agent treatment layer, such as an alkaline solution, an acidic solution, a reducing agent solution, and an oxidizing agent solution.

In the present invention, among thus treatment, particularly from the viewpoint of the productivity, a method using active radiation and a mask in combination and a method using atmospheric-pressure plasma treatment and a mask in combination are preferably applied. From the viewpoint of economy and safety, ultraviolet irradiation treatment, that is, UV irradiation treatment is preferable as the active radiation treatment.

In the case of UV irradiation treatment, if a material having UV permeability is selected as the inorganic layer, UV irradiation may be carried out by direct drawing or through a mask from the surface of the inorganic layer opposite to the surface subjected to the coupling agent treatment. Accordingly, in the present invention, the inactivation treatment is carried out preferably by UV irradiation, and hereinafter, the description will be given in detail.

The UV irradiation treatment in the present invention is treatment by putting an inorganic layer subjected to the coupling agent treatment in an apparatus generating ultraviolet rays (UV light) with a wavelength of 400 nm or shorter, and carrying out UV light irradiation, and the wavelength of UV light is wavelength of preferably 260 nm or shorter, and more preferably 200 nm or shorter. If irradiation of UV light with such short wavelength is performed in environments where oxygen exists, UV light energy is applied to a sample (coupling treatment layer) and at the same time, active oxygen and ozone in an excited state are generated in the periphery of the sample so that the inactivation treatment of the present invention can be effectively carried out. However, UV light absorption by oxygen is significant if the UV light has a wavelength of 170 nm or shorter, and therefore there is a need to consider carefully for making the UV light reach the inorganic coupling agent treatment layer. In the case of irradiation in completely oxygen-free environments, no effect for surface modification (inactivation) by active oxygen and ozone is exhibited, and therefore it is necessary to allow UV light to pass through and also active oxygen and ozone to reach there. For example, in addition to a countermeasure for the apparatus such that a UV light source is placed in a nitrogen atmosphere and irradiation of UV light after transmitting UV light through quartz glass is performed to shorten the distance from the quartz glass to the coupling treatment layer, thereby suppressing the UV light absorption; and a method for controlling absorption of UV light by oxygen as a method for controlling oxygen amount without employing common atmosphere for the environments, and a method for controlling a UV light source and gas current in the coupling treatment interlayer are also effective as methods for controlling the UV light permeation and ozone generation amount.

The UV light irradiation intensity is desirably 5 mW/cm$^2$ or higher and 200 mW/cm$^2$ or lower when measured by a UV actinometer having a sensitivity peak at least in a range of 150 nm to 400 nm in order to prevent the glass from denaturing. The UV light irradiation time is preferably 0.1 minutes or longer and 30 minutes or shorter, more preferably 0.5 minutes or longer, furthermore preferably 1 minute or longer, and particularly preferably 2 minutes or longer; and more preferably 10 minutes or shorter, furthermore preferably 5 minutes or shorter, and particularly preferably 4 minutes or shorter. If the UV light irradiation time is too long, the productivity may possibly be lowered and contrarily, if it is too short, a light source with high intensity is required or high control precision for irradiation time is required, and therefore it is undesirable. In the case of conversion into integrated light intensity, it is preferably 30 mJ/cm$^2$ to 360000 mJ/cm$^2$, more preferably 300 mJ/cm$^2$ to 120000 mJ/cm$^2$, and furthermore preferably 600 mJ/cm$^2$ to 60000 mJ/cm$^2$.

Pattern formation at the time of UV irradiation treatment can be carried out by intentionally forming parts where light irradiation is performed and parts where light irradiation is not performed. A method for forming a pattern may be a method in which parts where UV light is shielded and parts where UV light is not shielded are formed, a method of scanning UV light, or the like. In order to make the rim parts of the pattern clear, it is effective to shield UV light and to cover the coupling agent treatment layer with a shielding material. It is also effective to carry out scanning with parallel light of UV laser.

A light source to be used for the UV irradiation treatment is preferable examples thereof include an excimer lamp, a low pressure mercury lamp, a high pressure mercury lamp, a Xe lamp, a Xe excimer laser, an ArF excimer laser, a KrF excimer laser, a XeCl excimer laser, a XeF excimer laser, an Ar laser, a D2 lamp, and the like. Among them, an excimer lamp, a low pressure mercury lamp, a Xe excimer laser, an ArF excimer laser, a KrF excimer laser, and the like are preferable.

As described above, a pattern having good adhesion parts, which are parts with strong delamination strength between the inorganic layer and the film, and easily peeling parts, which are parts with weak delamination strength between the inorganic layer and the resin film, is formed depending on execution of inactivation (etching) in the coupling treatment layer subjected to the inactivation treatment. For example, as shown in Examples described below, in the case where γ-aminopropyltrimethoxysilane is applied to glass, UV non-irradiation parts become good adhesion parts with strong delamination strength, and UV irradiation parts become easily peeling parts since the delamination strength is weakened by breaking amino groups with UV irradiation. As shown in Measurement Examples described below, the above description can be assumed from the fact that atomic percent of nitrogen (N) element is lowered by UV irradiation and successively that of carbon (C) is also decreased, and therefore breakage of amino group and propyl is suggested. On the other hand, in the case where a coupling treatment layer is formed on the substrate by using a coupling agent having no functional group, e.g., n-propyltrimethoxysilane, the parts not irradiated with UV contrarily become easily peeling parts and good adhesion parts are formed by breaking propyl parts by UV light irradiation. As the substrate, use of glass as a basal plate is industrially advantageous, and in this case, it is more practical to lower the delamination strength by UV irradiation; however, it is supposedly possible to make the UV light irradiation parts be the good adhesion parts in accordance with the use, basal plate to be used, and delamination strength to be required.

(Application)

As an application example in the present invention, a non-resin part may be formed by forming a hole part penetrating the resin layer in the resin laminate or the laminate in the thickness direction. The part is not particularly limited and includes holes which are filled with a metal containing mainly a metal component such as Cu, Al, Ag, or Au; voids formed by a mechanical drill or laser boring; and voids on which a metal film is formed by sputtering, electroless plating, or seed layer formation; and the like.

Hereinafter, the case of using a polyimide-based resin will be illustrated.

(Method for Producing Polyimide Layer)

A polyimide layer is obtained by applying a polyamide acid solution to a coupling agent-treated surface subjected to patterning treatment and carrying out imidization with heating or chemical treatment after drying. In the case of a solvent-soluble polyimide resin, a polyimide layer is obtained by applying a polyimide resin solution to a coupling agent-treated surface subjected to patterning treatment and drying the solution. Further, a polyimide layer may be formed using an intermediate raw material such that a mixed state of a polyamide acid solution in which imidization is not partially completed and a solvent-soluble polyimide resin is dried and partially subjected to imidization.

The application of the polyamide acid solution or polyimide resin solution can be carried out by means such as spin coating, doctor blade, applicator, comma coater, screen printing method, casting from a cap with a slit, extrusion by an extruder, slit coating, reverse coating, dip coating, or the like, and conventionally known solution application methods can be used properly without being limited thereto.

The heating temperature at the time of drying the applied polyamide acid solution by the application means is preferably 50° C. to 120° C., and more preferably 80° C. to 100° C. The treatment time is preferably 5 minutes to 3 hours, and more preferably 15 minutes to 2 hours. The remaining solvent amount after drying is preferably 25% to 50%, and more preferably 35% to 45%.

The heating temperature at the time of forming the polyimide layer after heating the polyamide acid after drying is preferably 150° C. to 500° C., and more preferably 300° C. to 450° C. The heating time is preferably 0.05 to 10 hours. The heat treatment is usually carried out by increasing the temperature step by step or continuously. The temperature rising speed is preferably 20° C./minute or lower, more preferably 10° C./minute or lower, and particularly preferably 5° C./minute or lower. On the other hand, the temperature rising speed is most preferably 0.5° C./minute or higher.

In the case where heating imidization is carried out by continuous temperature rising, the condition is preferable such that the temperature is continuously increased from 100° C. to the highest reaching temperature of 150° C. to 500° C. at a temperature rising speed of 0.5° C./minute to 20° C./minute and is retained at the highest reaching temperature for 0.1 minutes to 120 minutes. More preferably, the temperature rising speed is 1° C./minute to 10° C./minute, the highest reaching temperature is from 300° C. to 480° C., and the retention time at the highest reaching temperature is 1 to 60 minutes, and most preferably, the temperature rising speed is 2° C./minute to 5° C./minute, the highest reaching temperature is from 400° C. to 450° C., and the retention time at the highest reaching temperature is 5 to 30 minutes. Herein, for convenience, the drying step and the imidization step are described separately; however actually drying and imidization proceed simultaneously in parallel. In the drying step at a relatively low temperature, drying dominantly proceeds and in the imidization step at a relatively high temperature, imidization reaction dominantly proceeds. It is a preferable embodiment in terms of industrial production to carry out the drying step and the imidization step as continuous heating treatment without separating these steps.

The temperature rising condition for the drying and imidization by heating is particularly preferable such that drying is carried out at 80° C. for 30 minutes and successively at 100° C. for 90 minutes, thereafter the temperature is increased to 400° C. at a temperature rising speed of 5° C./minute, and is retained at 400° C. for 5 min.

In the case of using a solvent-soluble polyimide resin or polyamide imide resin for the resin layer in the present invention, the drying temperature after application of a resin solution is preferably 150 to 380° C., and more preferably 185 to 330° C. The heating time is preferably 0.05 to 10 hours. The heating treatment is usually carried out by increasing the temperature step by step or continuously. The temperature rising speed is preferably 20° C./minute or lower, more preferably 10° C./minute or lower, and particularly preferably 5° C./minute or lower. On the other hand, the temperature rising speed is most preferably 0.5° C./minute or higher.

In the case of using a solvent-soluble resin other than the polyimide-based resin for the resin layer in the present invention, it is preferable to carry out drying and heating treatment in a temperature range of not beyond the boiling point of the solvent to be used +150° C., and preferably in a temperature range of not beyond the boiling point of the solvent to be used +120° C. Preferably, the drying time is properly selected so that the remaining solvent amount in the resin layer is at least 0.5% by mass or less.

In the case of using a thermoplastic resin material for the resin layer in the present invention, it is preferable to melt the resin material in a temperature higher than the melting point or softening point by 35° C. or higher, to apply the resin material in a melted state onto an inorganic basal plate, and to cool the resin material to room temperature at a cooling speed lower than 20° C./minute. If the temperature at the melting time is insufficient in the above-mentioned range, application unevenness tends to be caused. The upper limit of the melting temperature is not particularly set, but it is preferably 300° C. or lower, or not beyond the temperature higher than the melting point or softening temperature by 200° C. If it exceeds that temperature, deterioration of the resin material becomes significant and the mechanical strength of an obtained product may possibly be insufficient.

The polyimide layer in the present invention has an average coefficient of thermal expansion from 30 to 300° C. of preferably −5 ppm/° C. to +35 ppm/° C., more preferably −5 ppm/° C. to +20 ppm/° C., furthermore preferably −2 ppm/° C. to +12 ppm/° C., particularly preferably +0 ppm/° C. to +10 ppm/° C., and most preferably +1 ppm/° C. to +8 ppm/° C. The difference between the coefficient of thermal expansion of the polyimide layer and that of the inorganic basal plate becomes high if the coefficient is out of the range, and therefore the polyimide layer and the inorganic layer may possibly be separated easily during the heating process. In a metal or ceramics, the coefficient of thermal expansion is not often changed within the temperature range; however, the polyimide layer may show a CTE change in the temperature range. Accordingly, the measurement lower limit may be changed to 0° C., 30° C., or 50° C., and the measurement upper limit may be changed to 200° C., 300° C., or 400° C. For example, in the present invention, an average value from 30° C. to 300° C. is employed as the coefficient of thermal expansion of the polyimide film; however, the temperature range focused on is changed in accordance with the use, and in consideration of process at high temperature, in the case where the coefficient of thermal expansion is investigated in a range of 30° C. to 400° C., the range may be 100° C. to 400° C.; or in consideration of reflow process, in the case where it is investigated in a range of 50° C. to 280° C., the investigation may possibly be carried out while focusing on a use temperature range of −50° C. to 150° C.

The thickness of the polyimide layer in the present invention is not particularly limited, but it is preferably 0.5 µm to 50 µm, more preferably 1 µm to 40 µm, furthermore preferably 5 µm to 30 µm, and most preferably 7 to 15 µm. The unevenness in the thickness of the polyimide film is also preferably 20% or less. If the thickness is 0.5 µm or thinner, it is difficult to control the thickness and it becomes difficult to peel the polyimide layer from the inorganic layer. If the thickness is 50 µm or thicker, polyimide layer formation is difficult and at the time of peeling, the polyimide layer tends to be folded easily. Use of the polyimide layer having a thickness within the range affords a considerable contribution to making devices such as a sensor high performance and making electronic parts lightweight, compact, and thin.

A ring-closing catalyst may be used at the time of producing the polyimide layer. Concrete examples of the ring-closing catalyst to be used in the present invention include aromatic carboxylic acids such as benzoic acid; aliphatic tertiary amines such as trimethylamine and triethylamine; heterocyclic tertiary amines such as isoquinoline, pyridine, and beta-picoline; etc., and it is preferable to use at least one kind amine selected from heterocyclic tertiary amines. The content of the ring-closing catalyst is preferable to satisfy the ratio of (content (mol) of the ring-closing catalyst)/(content (mol) of polyamide acid, the precursor) within a range of 0.01 to 10.00.

A dehydration agent may be used at the time of producing the polyimide layer. Examples thereof include aliphatic carboxylic acid anhydrides such as acetic anhydride, propionic anhydride, and butyric anhydride; aromatic carboxylic acid anhydrides such as benzoic anhydride; etc., but the dehydration agent is not particularly limited thereto if it can carry out dehydration efficiently. The content of the dehydration agent is preferable to satisfy the ratio of (content (mol) of the dehydration agent)/(content (mol) of polyamide acid) within a range of 0.01 to 10.00.

(Laminate)

The laminate of the present invention is a laminate obtained by laminating an inorganic layer and a polyimide layer with a coupling agent treatment layer interposed therebetween, wherein the laminate has good adhesion parts and easily peeling parts with different delamination strength between the inorganic layer and the polyimide layer, and the good adhesion parts and the easily peeling parts form a prescribed pattern. Accordingly, the laminate does not cause peeling even in high temperature process at the time of device fabrication, and the polyimide layer can be easily peeled from the inorganic layer after a device is fabricated on the polyimide film. The laminate of the present invention can be obtained by the method for producing a laminate of the present invention, and the details of the inorganic layer, coupling treatment layer, polyimide layer, and the like are those described above.

In the present invention, for example, the good adhesion parts refers to parts with strong delamination strength of the inorganic layer and the polyimide layer by changing the surface properties in the presence or absence of UV light irradiation. In the present invention, for example, the easily peeling parts refers to parts with weak delamination strength of the inorganic layer and the polyimide layer by changing the surface properties in the presence or absence of UV light irradiation.

In the present invention, the 180-degree peel strength between the inorganic layer and the polyimide layer may be set properly in accordance with the kind and process of devices to be laminated thereon, and is not particularly limited, but the 180-degree peel strength in the easily peeling part is preferably 50% or lower, more preferably 30% or lower, and particularly preferably 20% or lower of the 180-degree peel strength of the good adhesion part. In general, the 180-degree peel strength of the good adhesion part is preferably 0.60 N/cm or higher, more preferably 1.0 N/cm or higher, furthermore preferably 2.0 N/cm or higher, and particularly preferably 3.0 N/cm or higher and the upper limit thereof is not particularly limited, but it is about 8 N/cm or lower. The 180-degree peel strength of the easily peeling part may be enough to satisfy the ratio to that of the good adhesion part, and is preferably 1.5 N/cm or lower, more preferably 1.0 N/cm or lower, furthermore preferably 0.5 N/cm or lower, particularly preferably 0.4 N/cm or lower, and most preferably 0.2 N/cm or lower. The lower limit thereof is preferably 0.01 N/cm or higher.

Herein, the lower limit of the 180-degree peel strength of the easily peeling part is a value determined in consideration of the bending energy of the polyimide layer. The 180-degree peel strength in the present invention can be measured by a method described in Examples below.

In the laminate of the present invention, unlike conventional laminates, no adhesive layer or the like is interposed between the inorganic layer and the polyimide layer, and there exists only an interlayer containing 10 mass % or more of Si derived from, for example, a coupling agent. The coupling treatment layer, which is an interlayer between the inorganic layer and the polyimide layer, can be made so extremely thin that it can exert effects such that generation of degassing components is small during heating, elution scarcely occurs even in wet process, and the amount to be eluted is only a small amount even if elution occurs. The coupling treatment layer generally contains a large amount of a heat resistant silicon oxide component so that heat resistance at a temperature of about 400° C. can be obtained.

(Method for Producing Device Structure)

The method for producing a device structure of the present invention is a method for producing a structure having a device formed on the polyimide film as a basal plate by using the laminate of the present invention having the substrate and the polyimide film.

In the method for producing a device structure of the present invention, a device is formed on the polyimide film of the laminate of the present invention, and thereafter a notch is formed in the polyimide film at the easily peeling part of the laminate, and the polyimide film is peeled from the substrate.

Examples of a method for forming a notch in the polyimide film at the easily peeling part of the laminate include, but are not particularly limited to, a method for cutting the polyimide film by cutting tool such as a cutter; a method for cutting the polyimide film by relatively scanning laser and the laminate; a method for cutting the polyimide film by relatively scanning water jet and the laminate; a method for cutting the polyimide film while forming a notch reaching slightly the glass layer by a dicing apparatus for a semiconductor chip; and the like. For example, when the above-mentioned method is employed, techniques for improving the cutting performance by using ultrasonic wave for a cutting tool in combination or by adding up and down movement to the reciprocating movement may be employed properly.

At the time of forming a notch in the polyimide layer at the easily peeling part of the laminate, the position to which the notch is formed may be sufficient if it includes at least a portion of the easily peeling part, and basically it is common to carry out cutting along with a pattern. However, an error may be caused when cutting is carried out accurately in the boundary of the good adhesion parts and the easily peeling parts along with a pattern, and therefore it is preferable to form the notch slightly closer to the easily peeling part side than the pattern in terms of an improvement in productivity. In order to prevent unintentional peeling before intentional peeling, there may also be a production manner where the notch is formed slightly closer to the good adhesion parts than the pattern. Further, if the width of the good adhesion part is set to be narrow, the polyimide layer remaining in the good adhesion parts at the time of peeling can be decreased, and the utilization efficiency is improved, and the device surface area to the laminate surface area is increased, resulting in improvement of the productivity. Moreover, a manner may also be employed as an extreme manner of the present invention such that an easily peeling part is formed in a portion of the outer circumferential part of the laminate, the outer circumferential part is set as a cutting position, and actually peeling is performed without forming a notch.

In the present invention, only the polyimide film of the laminate is cut and peeled, and therefore the inorganic layer part of the laminate can be reused.

A method for peeling the polyimide layer from the substrate is not particularly limited, but employable methods include a method of tear off the polyimide layer from an end with a pair of tweezers; a method of sticking a pressure-sensitive adhesive tape to one side of the notched portion of the polyimide layer bearing a device, and tear off the polyimide layer from the tape part; a method of vacuum adsorbing one side of the notched portion of the polyimide layer bearing a device, and tear off the polyimide film from that part; and the like. At the time of peeling, if a curve with a small curvature is formed in the notched portion of the polyimide film bearing a device, the stress may possibly be applied to the device in that part to break the device, and therefore peeling is desirably carried out in the state with a large curvature. For example, it is desirable to tear off the polyimide film while winding the polyimide film on a roll with a large curvature, or to tear off the polyimide layer by a machine with a configuration of positioning a roll with a large curvature at the peeling portion.

The device structure (polyimide film bearing a device) of the present invention is allowed to fix a reinforcing member until it is made to be a final product. In this case, the reinforcing member may be fixed after the device structure is peeled from the substrate, but it is preferable that the reinforcing member is fixed and thereafter a notch is formed in the polyimide film and the polyimide film is peeled from the inorganic layer, or that a notch is formed in the polyimide film and thereafter the reinforcing member is fixed in the notched portion and peeling is carried out. Examples of the reinforcing member may include methods for sticking and pressure-sensitive sticking another polymer film bearing a pressure-sensitive adhesive, and the like. An example of the polymer film bearing a pressure-sensitive adhesive includes a PET film; however, the process requiring high temperature has been already finished, and therefore the polymer film bearing a pressure-sensitive adhesive is less limited in the heat resistance than the polyimide film, and a variety of polymer films may be selected. Further, a PET film bearing a pressure-sensitive adhesive as a reinforcing member may be stuck only to the easily peeling part of the laminate of the present invention, and while the PET film bearing a pressure-sensitive adhesive is stuck to the easily peeling part, a notch is formed in the easily peeling part and the device-bearing polyimide layer may be peeled, or a PET film bearing a pressure-sensitive adhesive as a reinforcing member may be stuck to the entire body of the laminate of the present invention, a notch is then formed in the easily peeling part, and while the PET film bearing a pressure-sensitive adhesive is stuck to the easily peeling part, the device-bearing polyimide layer may be peeled.

In the case where the reinforcing member is fixed before peeling, examples as the reinforcing member may include extremely thin glass, SUS, and the like besides the above-mentioned polymer film. Use of a polymer film gives an advantage in that it keeps a device lightweight and is also advantageous in transparency, various processabilities, and hardly cracking properties. Use of extremely thin glass is advantageous in gas barrier properties, stability against chemicals, and transparency. Use of SUS is advantageous in electric shielding and hardly cracking properties.

In the present invention, a method for forming a device on the polyimide layer, a basal plate, may be carried out properly according to a conventionally known method. The device in the present invention is not particularly limited, and includes only wiring for electronic circuits and an electric resistance, as well as passive devices such as a coil and a capacitor, active devices including a semiconductor device and the like, and an electronic circuit system obtained by combining these devices. Examples of the semiconductor device include a solar cell, a thin film transistor, a MEMS device, a sensor, a logic circuit, and the like. The above-mentioned logic circuit includes an NAND, a logic circuit based on OR, and those synchronized by clock.

For example, a film-like solar cell using the laminate of the present invention is obtained by using the polyimide layer of the laminate of the present invention as a basal plate and forming a laminate X containing a photoelectric conversion layer made of a semiconductor on the basal plate. The laminate X has a photoelectric conversion layer for converting sunlight energy into electric energy as an indispensable constituent, and usually further has an electrode layer and the like for taking the obtained electric energy out.

Hereinafter, as a typical example of the laminate X so formed as to constitute a film-like solar cell, a lamination structure having a photoelectric conversion layer sandwiched between a pair of electrode layers will be described. A configuration formed by overlapping some photoelectric conversion layers can be referred to as a solar cell in the present invention if it is fabricated by PVD or CVD. Naturally, the lamination structure of the laminate X is not limited to the aspects described below, and the configuration of a laminate contained in a solar cell of a conventional technique may properly be referred to, and a protection layer and conventionally known auxiliary means may be added.

One electrode layer in the pair of electrode layers (hereinafter, also described as a back electrode layer) is preferably formed on one main surface of the polyimide layer. The back electrode layer is obtained by laminating a conductive inorganic material through a conventionally known method, e.g., a CVD (chemical vapor deposition) method or a sputtering method. Examples of the conductive inorganic material include metal thin films of Al, Au, Ag, Cu, Ni, stainless steel, etc., and oxide semiconductor type conductive materials such as $In_2O_3$, $SnO_2$, ZnO, $Cd_2SnO_4$, and ITO ($In_2O_3$ doped with Sn). The back electrode layer is preferably a metal thin film. The thickness of the back electrode layer is not particularly limited, and is usually about 30 to 1000 nm. Further, a film formation method using an Ag paste without requiring vacuum may be employed for leading a portion of an electrode.

The photoelectric conversion layer for converting sunlight energy into electric energy is a layer made of a semiconductor, the layer being made of a compound semiconductor thin film containing Group I elements, Group III elements, and Group VI elements (chalcopyrite structure semiconductor thin film) such as a $CuInSe_2$ (CIS) film or a $Cu(In,Ga)Se_2$ (CIGS) film obtained by forming its solid solution with Ga (hereinafter, both are collectively referred to as CIS-based film); or a silicon-based semiconductor. The silicon-based semiconductor includes a thin film silicon layer, an amorphous silicon layer, a polycrystalline silicon layer, and the like. The photoelectric conversion layer may be a laminate having a plurality of layers made of different semiconductors. Alternatively, the photoelectric conversion layer may be a photoelectric conversion layer using a pigment. Further, the photoelectric conversion layer may be a layer using an organic thin film semiconductor containing an organic compound such as conductive polymers or fullerene.

The thin film silicon layer is a silicon layer obtained by a plasma CVD method, a thermal CVD method, a sputtering method, a cluster ion beam method, an evaporation method, or the like.

The amorphous silicon layer is a layer made of silicon substantially having no crystallinity. The fact that the amorphous silicon layer substantially has no crystallinity can be confirmed by no diffraction peak in x-ray irradiation. A method for obtaining the amorphous silicon layer is known, and such a method includes a plasma CVD method, a thermal CVD method, and the like.

The polycrystalline silicon layer is a layer made of aggregates of micro-crystalline silicon. The polycrystalline silicon layer is distinguished from the amorphous silicon layer by giving a diffraction peak in x-ray irradiation. A method for obtaining the polycrystalline silicon layer is known, and such a method includes a method for heat treatment of amorphous silicon.

The photoelectric conversion layer is not limited to a silicon-based semiconductor layer, and may be a thick semiconductor layer. The thick semiconductor layer is a semiconductor layer formed by using a paste of titanium oxide, zinc oxide, copper iodide, or the like.

As means for constituting the photoelectric conversion layer by using a semiconductor material, conventionally known methods may properly be employed. For example, about 20 nm a-Si (n-layer) is formed by carrying out high frequency plasma discharge at a temperature of 200 to 500° C. in a gas obtained by adding phosphine ($PH_3$) to $SiH_4$, successively about 500 nm a-Si (i-layer) is formed in $SiH_4$ gas alone, and continuously about 10 nm p-Si (p-layer) is formed in a gas obtained by adding diborane ($B_2H_6$) to $SiH_4$.

Among the pair of electrode layers sandwiching the photoelectric conversion layer, the electrode layer (hereinafter, also referred to as a current collecting electrode layer) to be formed on the opposite side to the polyimide film basal plate may be an electrode layer formed by hardening a conductive paste containing conductive filler and a binder resin, or a transparent electrode layer. As the transparent electrode layer, oxide semiconductor-based materials such as $In_2O_3$, $SnO_2$, ZnO, $Cd_2SnO_4$, ITO ($In_2O_3$ doped with Sn) are preferably usable.

Consequently, a preferable aspect of the present invention, that is, a film-like solar cell is obtained by laminating layers of transparent electrode/p type a-Si/i type a-Si/n type a-Si/metal electrode/polyimide film in this order. The structure may be changed by using a-Si for the p-layer, polycrystalline silicon for the n-layer, and inserting a thin undoped a-Si layer between the layers. Particularly, if the structure is made to be an a-Si/polycrystalline silicon-based hybrid structure, the sensitivity to the sunlight spectrum can be improved. In fabrication of the solar cell, in addition to the structure, a reflection prevention layer, a surface protection layer and the like may be added.

The thin film transistor (TFT) refers to one fabricated by depositing thin films to form a semiconductor layer constituting a transistor and an insulating film, an electrode, a protection insulating film, etc., constituting devices. Usually, the thin film transistor is distinguished from those using silicon of a silicon wafer as a semiconductor layer. Usually, the thin film transistor is fabricated by a technique utilizing vacuum, for example, PVD (physical vapor deposition) such as vacuum vapor deposition, and CVD (chemical vapor deposition) such as plasma CVD. Therefore, the thin film transistor includes those which are not single crystal unlike a silicon wafer. Although using Si, the thin film transistor includes a microcrystalline silicon TFT, a high temperature polysilicon TFT, a low temperature polysilicon TFT, an oxide semiconductor TFT, an organic semiconductor TFT, and the like.

The MEMS device means a product fabricated by utilizing MEMS technique, and includes an inkjet printer head, a probe for a scanning type probe microscope, a contactor for an LSI prober, a spatial light modulator for mask-less exposure, an integrated optical device, an infrared sensor, a flow rate sensor, an acceleration sensor, a MEMS gyro sensor, an RF MEMS switch, an in vivo/in vitro blood pressure sensor, and a video projector using a grating light bulb, a digital micromirror device, or the like.

The sensor includes a strain gauge, a load cell, a semiconductor pressure sensor, an optical sensor, a photoelectronic device, a photodiode, a magnetic sensor, a contact temperature sensor, a thermistor temperature sensor, a resistance thermometer sensor, a thermocouple temperature sensor, a contactless temperature sensor, a radiation thermometer, a microphone, an ion concentration sensor, a gas concentration sensor, a displacement sensor, a potentiometer, a differential trans-displacement sensor, a rotation angle sensor, a linear encoder, a tachogenerator, a rotary encoder, a position sensitive detector (PSD), an ultrasonic range finder, an electrostatic capacitance displacement meter, a laser Doppler vibration velocimeter, a laser Doppler current meter, a gyro sensor, an acceleration sensor, an earthquake sensor, a one-dimensional, linear image sensor, a two-dimensional, CCD image sensor, a CMOS image sensor, a liquid/liquid leakage sensor (leak sensor), a liquid detection sensor (level sensor), a hardness sensor, an electric field sensor, an electric current sensor, a voltage sensor, an electric power sensor, an infrared sensor, a radiation sensor, a humidity sensor, an odor sensor, a flow sensor, an inclination sensor, a vibration sensor, a time sensor, a composite sensor obtained by combining these sensors, a sensor for outputting physical quantities or sensitivity values from the values detected by these sensors based on a certain calculation formula, and the like.

The 180-degree peel strength of the good adhesion part in the polyimide layer and the inorganic layer of the laminate in the present invention is preferably 1 N/cm or higher, and more preferably 2 N/cm or higher. The 180-degree peel strength of the easily peeling part is preferably 50% or lower, and more preferably 30% or lower to that of the good adhesion part. The 180-degree peel strength of the easily peeling parts is preferably 1 N/cm or lower, more preferably 0.5 N/cm, and furthermore preferably 0.05 N/cm or lower, but it is preferably 0.01 N/cm or higher. If the adhesion is too low, it may easily cause blisters.

The case of using a polyimide-based resin for the resin layer as a concrete embodiment of the present invention is illustrated above; however, in the present invention, the resin layer is not limited to polyimide, and a variety of reins described before may be used for application.

Regarding the method for producing a laminate of the present invention and the method for producing a device structure of the present invention described in detail, respective embodiments will be described with reference to drawings shown in FIG. 1 and FIG. 2.

FIG. 1 is a schematic view showing one embodiment of the method for producing a laminate of the present invention, wherein (1) shows a glass basal plate 1; (2) shows the step of forming a coupling treatment layer 2 by applying a coupling agent onto the glass basal plate 1, followed by drying; (3) shows the step of arranging a UV light shielding mask 3 and then irradiating UV light; and (4) shows the step of removing the UV light shielding mask 3 after UV light irradiation. Herein, the UV exposure part in the coupling treatment layer 2 becomes a UV irradiation part 5, and the remaining part becomes a UV non-irradiation part 4. Further, (5) shows the step of sticking a polyimide film 6, and (6) shows the step of forming a notch in a polyimide film 7 on the UV irradiation part and peeling the polyimide film 7 from the glass basal plate 1.

Figure 2:
FIG. 2 UV Irradiation Step Example 2: (1) inorganic layer, (2) silane coupling agent layer formation by applying a silane coupling agent to the inorganic layer, followed by drying, (3) UV irradiation treatment after arranging a mask for shielding UV light, (4) removal of the mask for shielding UV light after UV irradiation treatment, (5) fabrication of a resin layer and preparation of circuit wiring, and (6) cutting in the periphery of a UV irradiation treatment part in the silane coupling agent layer of the resin film and peeling of the resin film from glass.
Figure 2:
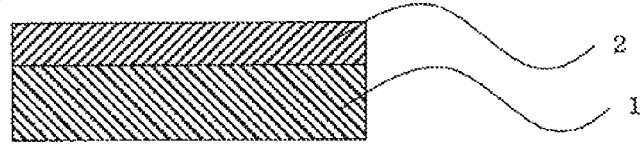
Figure 2:
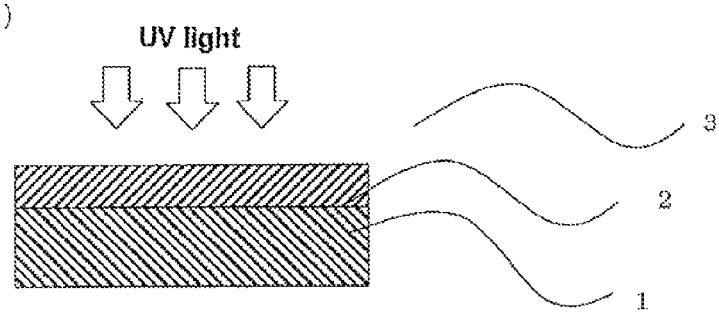
Figure 2:
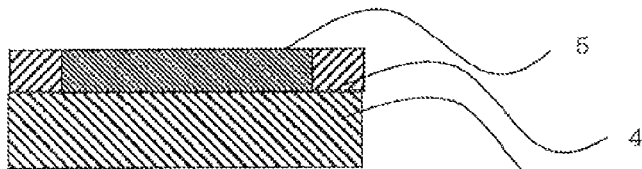
Figure 2:
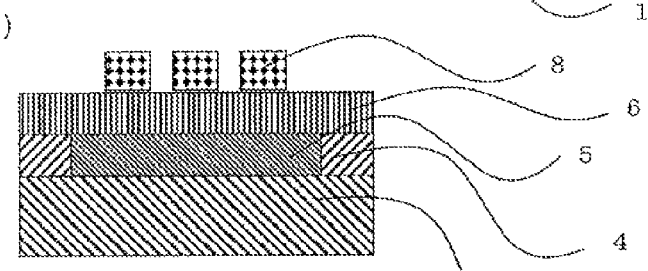
Figure 2:
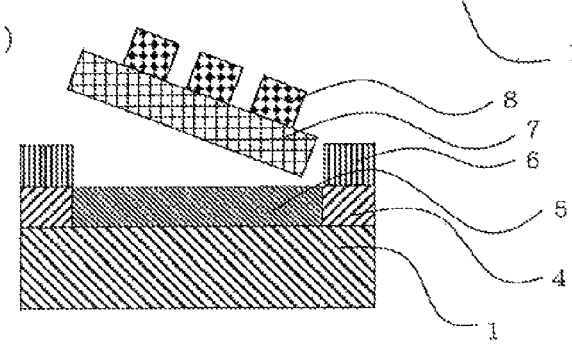

FIG. 2 is a schematic view showing one embodiment of the method for producing a device structure of the present invention, wherein (1) shows a glass basal plate 1; (2) shows the step of forming a coupling treatment layer 2 by applying a coupling agent onto the glass basal plate 1, followed by drying; (3) shows the step of arranging a UV light shielding mask 3 and then irradiating UV light; and (4) shows the step of removing the UV light shielding mask 3 after UV light irradiation. Herein, the UV exposure part in the coupling treatment layer 2 becomes a UV irradiation part 5, and the remaining part becomes a UV non-irradiation part 4. Further, (5) shows the step of sticking a polyimide film 6 and thereafter a device 8 is fabricated on the surface of a polyimide film 7 on the UV irradiation part, and (6) shows the step of forming a notch in the polyimide film 7 on the UV irradiation part and peeling the polyimide film 7 from the glass basal plate 1.

EXAMPLES

Hereinafter, the present invention will be described concretely by way of Examples and Comparative Examples; however, the present invention is not limited to Examples below. The evaluation methods for physical properties in Examples below are as follows.

1. Reduced Viscosity ($\eta sp/C$) of Polyamide Acid or Polyimide

Using a solution obtained by dissolving a polymer in a concentration of 0.2 g/dl in N-methyl-2-pyrrolidone (or N,N-dimethylacetamide), the reduced viscosity was measured at 30° C. with an Ubbelohde viscosity tube. (In the case where the solvent used for preparing a polyamide acid solution was N,N-dimethylacetamide, a polymer was dissolved in N,N-dimethylacetamide and measurement was carried out.)

2. Solution Viscosity of Polyamide Acid Solution or Polyimide Solution

Measurement was carried out at 20° C. using an E type viscometer (RE 105U model, manufactured by Toki Sangyo Co., Ltd.

3. Thickness of Resin Layer or the Like

Measurement was carried out using a micrometer ("Millitron 1245D", manufactured by Feinpruf).

4. Measurement of Warp of Resin Layer

A resin layer of an object to be measured was cut out in a size of 20 mm×20 mm and put on an aluminum foil and static electricity was removed. Thereafter, the film was put on a flat glass plate and the distance of four corners from the glass plate was measured with a gauge, and the average thereof was defined as the warp of the resin layer.

5. 180-Degree Peel Strength (1) Peel Strength of Portion Untreated by Inactivation Treatment An inorganic layer was subjected to prescribed coupling agent treatment, and a polyimide layer was formed without inactivation treatment, and the measurement of 180-degree peel strength was carried out in accordance with the following procedure.

(2) Peel Strength in Inactivated Part

An inorganic layer was subjected to prescribed coupling agent treatment, and a polyimide layer was formed after additional inactivation treatment was carried out, and the measurement of 180-degree peel strength was carried out in accordance with the following procedure.

A polyamide acid solution was applied using an applicator to an inorganic layer (100 mm-square) subjected to prescribed treatment based on the necessity in such a manner that a polyimide layer had a thickness of 25 μm by gap adjustment and a margin of about 10 mm from the rim of the inorganic layer was obtained, and thereafter the solution was dried by retaining the temperature at 80° C. for 30 minutes, successively increasing the temperature to 100° C. at 2° C./minute, and then retaining the temperature at 100° C. for 90 minutes in a nitrogen gas atmosphere in a muffle furnace, and further the imidization of the polyamide acid solution was carried out by increasing the temperature to 400° C. from 100° C. at a temperature rising speed of 5° C./minute and retaining the temperature at 400° C. for 5 minutes to obtain a laminate composed of polyimide layer/inorganic layer as a sample. An adhesive sheet SAFW manufactured by Nikkan Industries Co., Ltd. was layered on the polyimide layer of the sample, and further a commercialized polyimide film with a thickness of 25 μm and a rather large size was layered further thereon, and the obtained body was laminated at 100° C. by roll lamination, the resulting body was pressed at 160° C. for 1 hour and cooled to room temperature to obtain a laminate having SAFW between the commercialized polyimide film and the inorganic layer-resin layer laminate, and the measurement was carried out in such a manner that the commercialized polyimide film was set in the 180-degree folding side in accordance with 180-degree peeling method in JIS C6471, and the average for N=5 was defined as the measurement value.

Name of apparatus; Autograph AG-IS, manufactured by SHIMADZU CORPORATION

Measurement temperature; room temperature

Peeling speed; 50 mm/minute

Atmosphere; atmospheric air

Measurement sample width;

Interface peeling of the commercialized polyimide layer and SAFW or mixed destruction with material breakage of SAFE occurred around 8 N/cm, and therefore it can be only assumed that the peel strength of the inorganic layer and the polyimide layer was equal to or higher than 8 N/cm.

6. Coefficient of Thermal Expansion (CTE) of Resin Layer

The degree of shrinkage was measured under the following conditions for resin layer which has peeled off from the inorganic basal plate to be measured, the ratio of degree of shrinkage/temperature was measured at every 15° C. interval such as 30° C. to 45° C., 45° C. to 60° C. and the like, and this measurement was carried out up to 300° C., and then the average value of all measured values was calculated as a coefficient of thermal expansion (CTE).

Apparatus name: "TMA 4000S" manufactured by MAC Science

Specimen length: 20 mm

Specimen width: 2 mm

Temperature at which temperature rising starts: 25° C.

Temperature at which temperature rising finishes: 400° C.

Temperature rising speed: 5° C./minute

Atmosphere: argon

Initial load: 34.5 g/mm$^2$

7. Thickness of Coupling Agent Treatment Layer>

Measurement of the thickness of the coupling agent treatment layer (SC layer) was carried out for the thickness of a coupling agent treatment layer formed on a washed silicone wafer by an ellipsometry method using a spectroscopic ellipsometer ("FE-5000", manufactured by Photal) under the following conditions. In the case where glass was used as the substrate, samples were used which were separately obtained by applying a coupling agent on a washed Si wafer in the same manner as in respective Examples and Comparative Examples, followed by drying.

Reflection angle range: 45° to 80°

Wavelength range: 250 nm to 800 nm

Wavelength resolution: 1.25 nm

Spot diameter: 1 mm tan $\Psi$: measurement precision ±0.01 cos $\Delta$: measurement precision ±0.01

Measurement: rotating analysis method

Polarizer angle: 45°

Incident angle: fixed at 70°

Analyzer: at every 11.25° in a range of 0 to 360°

Wavelength: 250 nm to 800 nm

The thickness was calculated by fitting according to a nonlinear least-squares method. In this case, a model used was an Air/thin film/Si model and the wavelength dependencies C1 to C6 were calculated in accordance with the following expressions:

$$n = C3/\lambda 4 + C2/\lambda 2 + C1$$

$$k = C6/\lambda 4 + C5/\lambda 2 + C4.$$

8. Measurement of Surface Composition Ratio

The measurement of surface composition ratio was carried out by an electron spectroscopy for chemical analyzer (ESCA), using "ESCA 5801 MC", manufactured by ULVAC-PHI, Inc. under the following conditions. At the time of the measurement, first, the presence or absence of other elements was observed by entire element scanning, and then the narrow scanning for existing elements was carried out to measure the existence ratio. Herein, each sample to be subjected to the measurement was loaded to a measurement chamber after preliminary evacuation was sufficiently performed, and before the measurement, no process of grinding the sample surface by ion irradiation was performed.

X-ray for excitation: Mg, Kα beam
Photoelectron escape angle: 45°
Analysis diameter: φ800 μm
Path energy: 29.35 eV (narrow scanning), 187.75 eV (entire element scanning)
Steps: 0.125 eV (narrow scanning), 1.6 eV (entire element scanning)
Analysis elements: C, O, N, Si, and all elements
Vacuum degree: $1\times10^{-8}$ Torr or lower 9. Surface Roughness Ra of Inorganic Layer Surface The surface roughness Ra (surface conformation) of the inorganic layer surface (the coupling treatment layer surface) was measured by using a scanning probe microscope provided with a surface physical property evaluation function ("SPA 300/nanonavi", manufactured by SII Nano Technology Inc.). The measurement was carried out in DFM mode, "DF3" or "DF20" manufactured by SII Nano Technology Inc. was used as a cantilever, "FS-20A" manufactured by SII Nano Technology Inc. was used as a scanner, the scanning range was 10 μm square, and the measurement resolution was 512×512 pixel. After a secondary inclination correction was performed for the measurement image using software attached to the apparatus, if there was noise along with the measurement, other planarization treatments (e.g., flattening treatment) were properly employed, the Ra value was calculated using software attached to the apparatus. The measurement was carried out for arbitrary three points to determine the Ra values, and their average value was employed.

Synthesis Example 1

After a reaction container equipped with a nitrogen introduction pipe, a thermometer, and a stirring rod was replaced with nitrogen, 574 parts by mass of 5-amino-2-(p-aminophenyl)benzoxazole (DAMBO) and 9900 parts by mass of N-methyl-2-pyrrolidone (NMP) were introduced and completely dissolved; thereafter, 501 parts by mass of pyromellitic acid dianhydride (PMDA) and 50 parts by mass of maleic anhydride (MA) as a terminal sealing agent were introduced, and the mixture was stirred at a reaction temperature of 25° C. for 96 hours to obtain a yellow and viscous polyamide acid solution A. The properties of the polyamide acid solution are shown in Table 1.

Synthesis Example 2

A yellow and viscous polyamide acid solution B was obtained in the same manner as in Synthesis Example 1, except that 493 parts by mass of 4,4'-oxydianiline (ODA), 9000 parts by mass of NMP, 483 parts by mass of PMDA, and 48 parts by mass of MA were introduced and stirred for 120 hours.

Synthesis Example 3

A yellow and viscous polyamide acid solution C was obtained in the same manner as in Synthesis Example 1, except that 268 parts by mass of p-phenylenediamine (PDA), 8550 parts by mass of NMP, 659 parts by mass of 3,3',4,4'-biphenyltetracarboxylic acid dianhydride (BPDA), and 48.6 parts by mass of MA were introduced and stirred for 120 hours. The properties of the polyamide acid solution are shown in Table 1.

Synthesis Example 4

A yellow and viscous polyamide acid solution D was obtained in the same manner as in Synthesis Example 1, except that 133 parts by mass of p-phenylenediamine (PDA), 246 parts by mass of, 4,4'-oxydianiline (ODA), 8550 parts by mass of NMP, 483 parts by mass of PMDA, and 48 parts by mass of MA were introduced and stirred for 120 hours.

Synthesis Example 5

Production of Epoxy Group-Containing Alkoxysilane Partial Condensate

A reaction apparatus equipped with a stirrer, a water separator, a thermometer, and a nitrogen gas introduction pipe was charged with 200 parts by mass of glycidol and 1280 parts by mass of a tetramethoxysilane partial condensate (methylsilicate 51, average number of Si: 4, manufactured by TAMA CHEMICALS., CO., LTD.), and under nitrogen current, the mixture was heated to 90° C. while being stirred and thereafter added with 0.3 parts by mass of dibutyltin dilaurate as a catalyst to allow to react. During the reaction, when about 90 g of produced methanol was removed by distillation using the water separator, the reaction mixture was cooled. Next, about 10 g of methanol remaining in the reaction system was removed under reduced pressure at 13 kPa for about 10 minutes to obtain an epoxy group-containing alkoxysilane partial condensate.

Production of Silane-Modified Polyamide Acid Resin Composition

The polyamide acid in Synthesis Example 4 in an amount of 900 parts by mass was heated to 80° C., 26 parts by mass of the epoxy group-containing alkoxysilane partial condensate and 0.15 parts by mass of 2-methylimidazole as a catalyst were added to allow to react at 80° C. for 4 hours. The reaction mixture was cooled to room temperature to obtain a silane-modified polyamide acid solution E. (Equivalent of epoxy group of epoxy group-containing alkoxysilane partial condensate (2))/(equivalent of carboxylic acid group of tetracarboxylic acids used for polyamide acid)=0.07 at the time of charging.

Synthesis Example 6

In a dry nitrogen atmosphere, 333 parts by mass of 3,6-diphenyl-pyromellitic anhydride (DPPMDA), 489 parts by mass of 2,2'-bis(biphenyl)benzidine (BPBz), and 10 parts by mass of maleic anhydride (MA) as a terminal sealing agent were dissolved in m-cresol to obtain a 4 wt % solution. After the solution was stirred at room temperature for 2 hours, isoquinoline was added thereto as a catalyst and the obtained mixture was stirred at 200° C. for 30 minutes under nitrogen current to obtain a polyimide solution. The polyimide solution was re-precipitated in 2-propanol to obtain a yellow powdery polymer. The obtained polymer was washed with 2-propanol and dried and thereafter dissolved in N-methyl-2-pyrrolidone under heating to obtain a polyimide solution F with a resin concentration of 10 wt %.

Synthesis Example 7

After a reaction container equipped with a nitrogen introduction pipe, a thermometer, and a stirring rod was replaced with nitrogen, 8 mL of a solution mixture containing N-methyl-2-pyrrolidone (NMP) and γ-butyrolactone at a volume ratio of 50:50 was introduced, and when 0.888 g (2.55 mmol) of bis(4-aminophenyl)terephthalate (BAPT) was completely dissolved and thereafter 0.500 g (2.55 mmol) of 1,2,3,4-cyclobutane tetracarboxylic acid dianhydride (CBDA) was mixed and stirred, the viscosity of the resulting mixture increased intensely high within several minutes, and therefore the mixture was diluted with 4 ml of the above-mentioned mixing solvent and stirred further for one hour to obtain a transparent, yellow, and viscous polyamide acid solution G. The resin concentration was 10 wt %, the solution viscosity was 57 Pa·S, and the reduced viscosity was 1.8 dL/g.

Synthesis Example 8

After a reaction container equipped with a nitrogen introduction pipe, a thermometer, and a stirring rod was replaced with nitrogen, 5 mmol (1.6012 g) of 2,2'-bis(trifluoromethyl)benzidine was dissolved in 15 mL of N,N-dimethylacetamide sufficiently dewatered by a molecular sieve 4 A, and thereafter 5 mmol (1.1208 g) of a 1,3-dimethyl-1,2,3,4-cyclobutanetetracarboxylic acid anhydride powder was gradually added thereto. The mixture was stirred at room temperature for 48 hours to obtain a transparent, pale yellow, and viscous polyamide acid solution H. The resin concentration was 15 wt %, the solution viscosity was 52 Pa·S, and the reduced viscosity was 1.73 dL/g.

Synthesis Example 9

After a reaction container equipped with a nitrogen introduction pipe, a thermometer, and a stirring rod was replaced with nitrogen, 411 parts by mass of 2,2'-bis[4-(4-aminophenoxy)phenyl]propane (BAPP), 750 parts by mass of N-methyl-2-pyrrolidone, and 5.08 parts by mass of triethylamine were added thereto and stirred to obtain a solution.

The solution was further added with 202 parts by mass of 1,2,4,5-cyclohexanetetracarboxylic acid dianhydride (HP-MDA), 21.8 parts by mass of pyromellitic acid dianhydride, and 204 parts by mass of NMP, and thereafter the resulting solution was heated to 200° C. over 30 minutes by a mantle heater and retained at 200° C. for 5 hours while substances to be removed by distillation were removed.

After 1440 parts by mass of N,N-dimethylacetamide was added, the solution was made to be uniform by being stirred at 130° C. for 30 minutes and air-cooled to 100° C. to obtain a polyimide solution I. This solution had a resin concentration of 20 wt %, a solution viscosity of 200 Pa·S, and a reduced viscosity of 1.11 dL/g.

Polyamide Acid Solution

TABLE 1

|  |  | Unit | Synthesis Example 1 | Synthesis Example 2 | Synthesis Example 3 |
|---|---|---|---|---|---|
| Polyamide acid solution composition: mol % in parenthesis | Aromatic diamines |  | DAMBO (10) | ODA (10) | PDA (10) |
|  | Aromatic tetracarboxylic acid anhydrides |  | PMDA (9) | PMDA (9) | BPDA (9) |
|  | Terminal sealing agent |  | MA (2) | MA (2) | MA (2) |
| Solvent |  |  | NMP | NMP | NMP |
| Resin concentration |  | wt % | 10 | 10 | 10 |
| Solution viscosity |  | Pa·-s | 17 | 15 | 23 |
| Reduced viscosity |  | dL/g | 2.2 | 2.1 | 2.3 |
| Name |  |  | Polyamide acid solution A | Polyamide acid solution B | Polyamide acid solution C |

Polyamide Acid Solution

Polyimide Solution

TABLE 2

|  |  | Unit | Synthesis Example 4 | Synthesis Example 5 | Synthesis Example 6 |
|---|---|---|---|---|---|
| Polyamide acid solution composition: mol % in | Aromatic diamines |  | PDA (5) ODA (5) | PDA (5) ODA (5) | BPBz (10) |

TABLE 2-continued

|  |  | Unit | Synthesis Example 4 | Synthesis Example 5 | Synthesis Example 6 |
|---|---|---|---|---|---|
| parenthesis | Aromatic tetracarboxylic acid anhydrides |  | PMDA (9) | PMDA (9) | DPPMDA (9) |
|  | Terminal sealing agent |  | MA (2) | MA (2) | MA (2) |
|  | Other |  |  | epoxy group-containing alkoxysilane (0.6 equivalents) | (1) |
| Solvent |  |  | NMP | NMP | NMP |
| Resin concentration |  | wt % | 10 | 10 | 10 |
| Solution viscosity |  | Pa · -s | 25 | 50 | 90 |
| Reduced viscosity |  | dL/g | 2.3 | 2.3 | 1.4 |
| Name |  |  | Polyamide acid solution D | Polyamide acid solution E | Polyimide solution F |

Synthesis Example 10

After a reaction container equipped with a nitrogen introduction pipe, a thermometer, and a stirring rod was replaced with nitrogen, 574 parts by mass of 5-amino-2-(p-aminophenyl)benzoxazole (DAMBO) and 9900 parts by mass of N-methyl-2-pyrrolidone (NMP) were introduced and completely dissolved; thereafter, 501 parts by mass of pyromellitic acid dianhydride (PMDA) and 25 parts by mass of maleic anhydride (MA) as a terminal sealing agent were introduced, and the mixture was stirred at a reaction temperature of 25° C. for 96 hours to obtain a yellow and viscous polyamide acid solution a. The properties of the polyamide acid solution are shown in Table 3.

Synthesis Example 11

A yellow and viscous polyamide acid solution b was obtained in the same manner as in Synthesis Example 10, except that 268 parts by mass of p-phenylenediamine (PDA), 8550 parts by mass of NMP, 657 parts by mass of biphenyltetracarboxylic acid dianhydride (BPDA), and 25 parts by mass of MA were introduced and stirred for 120 hours. The properties of the polyamide acid solution are shown in Table 3.

Synthesis Example 12

A yellow and viscous polyamide acid solution c was obtained in the same manner as in Synthesis Example 10, except that 493 parts by mass of 4,4'-oxydianiline (ODA), 9000 parts by mass of NMP, 483 parts by mass of PMDA, and 24 parts by mass of MA were introduced. The properties of the polyamide acid solution are shown in Table 3.

Synthesis Example 13

A yellow and viscous polyamide acid solution d was obtained in the same manner as in Synthesis Example 10, except that 537 parts by mass of DAMBO, 84 parts by mass of ODA, 10800 parts by mass of NMP, 580 parts by mass of PMDA, and 28 parts by mass of MA were introduced. The properties of the polyamide acid solution are shown in Table 3.

Synthesis Example 14

A yellow and viscous polyamide acid solution e was obtained in the same manner as in Production Example 1, except that 418 parts by mass of DAMBO, 66 parts by mass of ODA, 9000 parts by mass of NMP, 401 parts by mass of PMDA, 95 parts by mass of BPDA, and 21 parts by mass of MA were introduced. The properties of the polyamide acid solution are shown in Table 4.

Synthesis Example 15

A yellow and viscous polyamide acid solution f was obtained in the same manner as in Production Example 1, except that 155 parts by mass of DAMBO and 322 parts by mass of ODA as diamines, 8550 parts by mass of NMP, 451 parts by mass of PMDA, and 22.5 parts by mass of MA were introduced. The properties of the polyamide acid solution are shown in Table 4.

TABLE 3

|  |  | Unit | Synthesis Example 10 | Synthesis Example 11 | Synthesis Example 12 |
|---|---|---|---|---|---|
| Polyamide acid solution composition: mol % in parenthesis | Aromatic diamines |  | DAMBO (100) | FDA (100) | ODA (100) |
|  | Aromatic tetracarboxylic acid anhydrides |  | PMDA (99) | BPDA (99) | PMDA (99) |
|  | Terminal sealing agent |  | MA (1) | MA (1) | MA (1) |

TABLE 3-continued

|  | Unit | Synthesis Example 10 | Synthesis Example 11 | Synthesis Example 12 |
|---|---|---|---|---|
| Solvent | | NMP | NMP | NMP |
| Resin concentration | wt % | 10 | 10 | 10 |
| Solution viscosity | Pa·s | 17 | 15 | 23 |
| Reduced viscosity | dL/g | 2.2 | 2.1 | 2.3 |
| Name | | Polyamide acid solution a | Polyamide acid solution b | Polyamide acid solution c |

TABLE 4

|  |  | Unit | Synthesis Example 13 | Synthesis Example 14 | Synthesis Example 15 |
|---|---|---|---|---|---|
| Polyamide acid solution composition: mol % in parenthesis | Aromatic diamines | | DAMBO (85) ODA (15) | DAMBO (85) ODA (15) | DAMBO (30) ODA (70) |
| | Aromatic tetracarboxylic acid anhydrides | | PMDA (99) — | BPDA (84.2) BPDA (14.8) | PMDA (99) — |
| | Terminal sealing agent | | MA (1) | MA (1) | MA (1) |
| Solvent | | | NMP | NMP | NMP |
| Resin concentration | | wt % | 10 | 10 | 10 |
| Solution viscosity | | Pa·s | 25 | 27 | 28 |
| Reduced viscosity | | dL/g | 2.3 | 2.4 | 2.4 |
| Name | | | Polyamide acid solution d | Polyamide acid solution e | Polyamide acid solution f |

Inorganic Layer Treatment Example 1

After a glove box was replaced with nitrogen, a coupling agent (3-aminopropyltrimethoxysilane; 3-APS) was diluted with isopropyl alcohol in the glove box in which N2 was flowing to obtain a diluted coupling agent solution with 0.5 wt % concentration, and separately an 8-inch silicon wafer (diameter 20 cm, thickness 0.725 mm) as an inorganic layer was ultrasonic-washed with pure water for 5 minutes, ultrasonic-washed with ethanol for 5 minutes, ultrasonic-washed with pure water for 5 minutes, and then dried. The silicon wafer was set on a spin coater, coated with isopropyl alcohol which was spread by spinning at 1000 rpm and dried, and thereafter wetted in the entire surface by dropwise addition of the diluted coupling agent solution to the center while being rotated up to 3000 rpm over 15 seconds, kept rotating at 3000 rpm for 15 seconds, and stopped rotating over 15 seconds, and then dried. The resulting silicon wafer was placed on a hot plate put on a clean bench and heated at 100° C. for 1 minute to cause reaction with the inorganic layer so that a treated inorganic layer 1 was obtained. The results are shown in Table 5. The thickness of the coupling agent layer was calculated by the above-mentioned method with ellipsometer. The thickness of the coupling agent layer was 11 nm.

Inorganic Layer Treatment Example 2

A treated inorganic layer 2 was obtained in the completely same manner as in Treatment Example 1, except that the coupling agent was changed to 3-APS and the inorganic layer was changed to glass (Corning EAGLE XG, 100 mm×100 mm, 0.7 mm thickness). The results are shown in Table 5.

Inorganic Layer Treatment Example 3

A treated inorganic layer 3 was obtained in the completely same manner as in Treatment Example 1, except that the coupling agent was changed to n-propyltrimethoxysilane (n-PS) and the inorganic layer was changed to glass (Corning EAGLE XG, 100 mm×100 mm, 0.7 mm thickness). The results are shown in Table 5.

Treatment Results of Inorganic Layers

TABLE 5

|  | Unit | Inorganic Layer Treatment Example 1 | Inorganic Layer Treatment Example 2 | Inorganic Layer Treatment Example 3 |
|---|---|---|---|---|
| Basal plate | — | Silicon wafer | Glass | Glass |
| Thickness | Nm | 0.725 | 0.7 | 0.7 |
| CTE | ppm/° C. | 3.0 | 3.2 | 3.2 |
| Coupling agent | — | 3-APS | 3-APS | n-PS |
| Thickness of SC agent layer | nm | 11 | 11 | 11 |
| Name | — | Treated inorganic layer 1 | Treated inorganic layer 2 | Treated inorganic layer 3 |

Example 1

An SUS plate from which a 70 mm square was cored was put so as to be in contact with the silicon wafer of the treated inorganic layer 1, and UV irradiation treatment was carried out for 2 minutes in a manner of irradiating only the center part of the silicon wafer with UV light. The UV irradiation treatment was carried out using a UV/O3 washing and reforming apparatus (SKB 1102N-01) manufactured by Lan Technical Service Co., Ltd., at a distance of about 3 cm from a UV lamp (SE-1103G05) under room temperature and atmospheric air. The illuminance of the UV light was 22 mW/cm2 in the case of measurement using an ultraviolet actinometer having a sensitivity peak at 254 nm. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. Thereafter, the polyamide acid solution A was applied by an applicator. The gap was adjusted so that the thickness of the polyimide layer was 25 μm. After the resulting silicon wafer was set in a muffle furnace in which $N_2$ was flowing, the polyamide acid solution was heated at 80° C. for 30 minutes and to 100° C. at 2° C./minute, and retained at 100° C. for 90 minutes for drying, and the imidization of the polyamide acid solution was carried out by heating to 400° C. from 100° C. at a temperature rising speed of 5° C./minute and keeping the temperature of 400° C. for 5 minutes to obtain a laminate 1. The UV-irradiated 70 mm square part of the polyimide layer of the laminate 1 was cut out in approximately 60 mm square and peeled with a pair of tweezers to obtain a polyimide film 1 by easy peeling. The evaluation results of the obtained laminate are shown in Table 6. The thickness of the coupling agent layer after the UV irradiation treatment was calculated by the above-mentioned method with ellipsometer after two-minute UV irradiation treatment. In this case, the measurement was impossible.

Example 2

A laminate 2 and a polyimide film 2 were obtained in the completely same manner as in Example 1, except that the inorganic layer was changed to the treated inorganic layer 2 and the gap of the applicator was adjusted so that the thickness of the polyimide layer was 10 μm. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 6.

Example 3

A laminate 3 and a polyimide film 3 were obtained in the completely same manner as in Example 1, except that the inorganic layer was changed to the treated inorganic layer 3, the gap of the applicator was adjusted so that the thickness of the polyimide layer was 30 μm, and UV irradiation treatment was carried out for 1 minute while the 70 mm square in the center part of the silicon wafer being masked. The surface roughness (Ra) in the UV non-irradiated part of the inorganic layer surface (SC layer surface) after the UV irradiation treatment was 0.4 nm, and the surface roughness (Ra) in the UV non-irradiated part was 0.3 nm. The evaluation results of the obtained laminate are shown in Table 6.

Example 4

A laminate 4 and a polyimide film 4 were obtained in the completely same manner as in Example 1, except that the inorganic layer was changed to the treated inorganic layer 2, the gap of the applicator was adjusted so that the thickness of the polyimide layer was 25 μm, and the polyamide acid solution was changed to the polyamide acid solution B. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 6.

Example 5

A laminate 5 and a polyimide film 5 were obtained in the completely same manner as in Example 1, except that the inorganic layer was changed to the treated inorganic layer 2, the gap of the applicator was adjusted so that the thickness of the polyimide layer was 25 μm, and the polyamide acid solution was changed to the polyamide acid solution C. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 6.

Example 6

A laminate 6 and a polyimide film 6 were obtained in the completely same manner as in Example 1, except that the inorganic layer was changed to the treated inorganic layer 2, the gap of the applicator was adjusted so that the thickness of the polyimide layer was 25 μm, and the polyamide acid solution was changed to the polyamide acid solution D. The surface roughness (Ra) in the UV non-irradiated part of the inorganic layer surface (SC layer surface) after the UV irradiation treatment was 0.4 nm, and the surface roughness (Ra) in the UV non-irradiated part was 0.5 nm. The evaluation results of the obtained laminate are shown in Table 7.

Example 7

A laminate 7 and a polyimide film 7 were obtained in the completely same manner as in Example 1, except that the inorganic layer was changed to the treated inorganic layer 2 and the polyamide acid solution was changed to the polyamide acid solution E. The surface roughness (Ra) in the UV non-irradiated part of the inorganic layer surface (SC layer surface) after the UV irradiation treatment was 0.4 nm, and the surface roughness (Ra) in the UV non-irradiated part was 0.5 nm. The evaluation results of the obtained laminate are shown in Table 7.

Example 8

A laminate 7 and a polyimide film 7 were obtained in the completely same manner as in Example 1, except that the inorganic layer was changed to the treated inorganic layer 2, the polyamide acid solution was changed to the polyimide solution F, and the inorganic layer coated with the solution was placed in a muffle furnace in which $N_2$ was flowing and dried by heating at 80° C. for 30 minutes, successively heating to 120° C. at 2° C./minute, retaining at 120° C. for 15 minutes, heating to 350° C. from 120° C. at a temperature rising speed of 5° C./minute, and keeping at 350° C. for 1 hour to obtain a laminate. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 7.

Example 9

A laminate 8 and a polyimide film 8 were obtained in the completely same manner as in Example 1, except that the inorganic layer was changed to the treated inorganic layer 2, the polyamide acid solution was changed to the polyimide solution G, the gap of the applicator was adjusted so that the thickness of the polyimide layer was 25 μm, and the inorganic layer coated with the solution was placed in a muffle furnace in which $N_2$ was flowing and dried by heating at 80° C. for 50 minutes, successively heating to 300° C. from 80° C. at a temperature rising speed of 3° C./minute, and keeping at 300° C. for 1 hour to obtain a laminate. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 7.

Example 10

A laminate 9 and a polyimide film 9 were obtained in the completely same manner as in Example 1, except that the inorganic layer was changed to the treated inorganic layer 2, the polyamide acid solution was changed to the polyimide solution H, the gap of the applicator was adjusted so that the thickness of the polyimide layer was 15 μm, and the inorganic layer coated with the solution was placed in a muffle furnace in which $N_2$ was flowing and dried by heating at 60° C. for 120 minutes, successively heating to 330° C. from 60° C. at a temperature rising speed of 3° C./minute, and keeping at 300° C. for 2.5 hours to obtain a laminate. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 7.

Example 11

A laminate 11 and a polyimide film 11 were obtained in the completely same manner as in Example 1, except that the inorganic layer was changed to the treated inorganic layer 2, the polyamide acid solution was changed to the polyimide solution I, and the inorganic layer coated with the solution was placed in a muffle furnace in which $N_2$ was flowing and dried by heating at 100° C. for 60 minutes, successively heating to 200° C. from 100° C. at a temperature rising speed of 5° C./minute, and keeping at 200° C. for 300 minutes to obtain a laminate. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 8.

Example 12

Inorganic Layer Treatment Example 4

After a glove box was replaced with nitrogen, a coupling agent (3-aminopropyltrimethoxysilane; 3-APS) was diluted with isopropyl alcohol in the glove box in which N2 was flowing to obtain a diluted coupling agent solution with 0.8 wt % concentration. As an inorganic layer, white sheet glass in a size of 370 mm×470 mm and 3 mm thickness was set on a spin coater, coated with isopropyl alcohol which was spread by spinning at 1000 rpm and dried, and thereafter wetted in the entire surface by dropwise addition of the diluted coupling agent solution to the center while being rotated up to 1800 rpm over 15 seconds, kept rotating at 1800 rpm for 30 seconds, and stopped rotating over 15 seconds, and then dried. The sheet glass was placed on a hot plate put on a clean bench and heated at 100° C. for 1 minute to cause reaction with the inorganic layer so that a treated inorganic layer 4 was obtained. The thickness of the coupling agent layer measured by an ellipsometer was 25 nm. The surface roughness (Ra) in the UV non-irradiated part of the inorganic layer surface (SC layer surface) after the UV irradiation treatment was 0.6 nm, and the surface roughness (Ra) in the UV non-irradiated part was 0.6 nm.

A metal mask having two aperture parts of 200 mm×300 mm was laminated to the obtained treated inorganic layer, and the treated inorganic layer was exposed such that integral irradiation energy was 3000 mJ/cm2 by a UV lamp having the same light emitting properties as those of the UV lamp employed in Example 1.

A polycarbonate resin (viscosity average molecular weight 44,000) containing bisphenol A as a bisphenol component in an amount of 25 parts by mass was added to a solvent mixture containing 50 parts by mass of 1,3-dioxolane and 50 parts by mass of tetrahydrofuran and then dissolved under heating and stirring at 45° C. for 8 hours to obtain a transparent solution composition.

The obtained solution plastic substance was applied by an applicator onto the treated inorganic layer after the UV irradiation in a manner of adjusting the dry thickness of 75 μm and dried by heating at 50° C. for 10 minutes, further increasing the temperature to 75° C. for 15 minutes, and further increasing the temperature to 105° C. for 45 minutes to obtain a laminate of the present invention.

The 180-degree peel strength of the UV non-irradiated part of the present laminate was 3.4 N/cm, and the 180-degree peel strength of the UV irradiation part was 0.8 N/cm.

Example 13

A treated inorganic basal plate which was subjected to UV irradiation was obtained in the same operation as in Example 12. Next, the obtained treated inorganic basal plate was heated to 240° C. and a polyethylene terephthalate resin heat-melted at 340° C. was extruded thereon such that the resin had a thickness of 120 μm in a nitrogen atmosphere and cooled to room temperature at an average cooling speed of 3° C./minute to obtain a laminate of the present invention. The 180-degree peel strength of the UV non-irradiated part of the present laminate was 2.2 N/cm, and the 180-degree peel strength of the UV irradiation part was 0.4 N/cm.

Example 14

A laminate of the present invention was obtained in the same operation as in Example 12, except that the following melamine-curable copolymer polyester resin solution was used in place of the polycarbonate resin solution and the drying condition was changed to at 75° C. for 15 minutes, at 105° C. for 15 minutes, and at 150° C. for 30 minutes in Example 12.

Preparation of Melamine Curable Copolymer Polyester Resin Solution:

A copolymer polyester resin (trade name, "Vylon V-200", manufactured by TOYOBO CO., LTD.) in an amount of 100 parts by mass and a melamine resin (trade name, "SUPER BECKAMINE J-820", manufactured by DIC Corporation) in an amount of 10 parts by mass were blended with toluene in an amount of 300 parts by mass, and these components were mixed and stirred at 25° C. for 4 hours to obtain the melamine curable copolymer polyester.

The 180-degree peel strength of the UV non-irradiated part of the obtained laminate was 2.7 N/cm and the 180-degree peel strength of the UV irradiation part was 0.7 N/cm.

TABLE 6

|  |  | Unit | Example 1 | Example 2 | Example 3 | Example 4 | Example 5 |
|---|---|---|---|---|---|---|---|
| Solution used |  |  | Polyamide acid solution A | Polyamide acid solution A | Polyamide acid solution A | Polyamide acid solution B | Polyamide acid solution C |
| Thickness of polyimide layer |  | μm | 25 | 9 | 31 | 25 | 26 |
| CTE of polyimide film |  | ppm/° C. | 1.2 | 1.2 | 1.2 | 25 | 8.0 |
| Inorganic layer used |  |  | Treated inorganic layer 1 | Treated inorganic layer 2 | Treated inorganic layer 3 | Treated inorganic layer 2 | Treated inorganic layer 2 |
| Peel strength | Good adhesion parts | N/cm | 4.3 | 7.2 | 2.1 | 7.1 | 3.4 |
|  | Easily peeling parts | N/cm | 0.1 | 0.5 | 0.2 | 0.3 | 0.4 |
| Warp of polyimide film |  | mm | 0.5 | 0.4 | 0.5 | 1.2 | 0.8 |
| Name |  |  | Laminate 1 | Laminate 2 | Laminate 3 | Laminate 4 | Laminate 5 |

TABLE 7

|  |  | Unit | Example 6 | Example 7 | Example 8 | Example 9 | Example 10 |
|---|---|---|---|---|---|---|---|
| Solution used |  |  | Polyamide acid solution D | Polyamide acid solution E | Polyimide solution F | Polyamide acid solution G | Polyamide acid solution H |
| Thickness of polyimide film |  | μm | 21 | 26 | 25 | 23 | 16 |
| CTE of polyimide film |  | ppm/° C. | 15 | 5.3 | 3.7 | 23 | 27 |
| Inorganic layer used |  |  | Treated inorganic layer 2 | Treated inorganic layer 2 | Treated inorganic layer 2 | Treated inorganic layer 2 | Treated inorganic layer 2 |
| Peel strength | Good adhesion parts | N/cm | 7.0 | 7.5 | 7.11 | 6.4 | 5.7 |
|  | Easily peeling parts | N/cm | 0.4 | 0.3 | 0.2 | 0.3 | 0.2 |
| Warp of polyimide film |  | mm | 1.2 | 0.4 | 0.1 | 0.3 | 0.6 |
| Name |  |  | Laminate 6 | Laminate 7 | Laminate 8 | Laminate 9 | Laminate 10 |

TABLE 8

|  |  | Unit | Example 11 |
|---|---|---|---|
| Solution used |  |  | Polyimide solution I |
| Thickness of polyimide film |  | μm | 20 |
| CTE of polyimide film |  | ppm/° C. | 21 |
| Inorganic layer used |  |  | Treated inorganic layer 2 |
| Peel strength | Good adhesion parts | N/cm | 7.2 |
|  | Easily peeling parts | N/cm | 0.8 |
| Warp of polyimide film |  | mm | 0.6 |
| Name |  |  | Laminate 11 |

Comparative Example 1

A laminate 11 and a polyimide film 11 were obtained in the completely same manner as in Example 1, except that the inorganic layer was changed to untreated glass (Corning EAGLE XG 100 mm×100 mm, 0.7 mm thickness). The evaluation results of the obtained laminate are shown in Table 9.

Comparative Example 2

A laminate 12 and a polyimide film 12 were obtained in the completely same manner as in Example 1, except that the inorganic layer was changed to untreated silicon wafer (diameter 20 cm, 0.725 mm thickness). The evaluation results of the obtained laminate are shown in Table 9.

Comparative Example 3

A laminate 13 was obtained in the completely same manner as in Example 1, except that no UV irradiation treatment was carried out for the inorganic layer. The evaluation results of the obtained laminate are shown in Table 9.

Comparative Example 4

A laminate 14 was obtained in the completely same manner as in Example 1, except that the inorganic layer was changed to the treated inorganic layer 2 and no UV irradiation treatment was carried out for the inorganic layer. The evaluation results of the obtained laminate are shown in Table 9.

TABLE 9

|  | Unit | Comparative Example 1 | Comparative Example 2 | Comparative Example 3 | Comparative Example 4 |
|---|---|---|---|---|---|
| Solution used |  | Polyamide acid solution A | Polyamide acid solution A | Polyamide acid solution A | Polyamide acid solution A |
| Thickness of polyimide film | μm | 25 | 24 | 23 | 24 |
| CTE of polyimide film | ppm/° C. | 1.2 | 1.2 | 1.3 | 1.2 |
| Inorganic layer used |  | Glass | Silicon wafer | Treated inorganic layer 1 | Treated inorganic layer 2 |
| UV light irradiation |  | Presence | Presence | Absence | Absence |
| Peel strength Good adhesion parts | N/cm | 0.1 | 0.4 | 3.1 | 6.8 |
| Peel strength Easily peeling parts | N/cm | 0.1 | 0.4 | 3.1 | 6.8 |
| Warp of polyimide film | mm | 0.5 | 0.5 | 0.5 | 0.5 |
| Name |  | Laminate 11 | Laminate 12 | Laminate 13 | Laminate 14 |

Comparative Example 5

A laminate 15 was obtained in the completely same manner as in Example 5, except that no UV irradiation treatment was carried out for the inorganic layer. The evaluation results of the obtained laminate are shown in Table 10.

Comparative Example 6

A laminate 16 was obtained in the completely same manner as in Example 6, except that no UV irradiation treatment was carried out for the inorganic layer. The evaluation results of the obtained laminate are shown in Table 10.

TABLE 10

|  | Unit | Comparative Example 5 | Comparative Example 6 |
|---|---|---|---|
| Solution used |  | Polyamide acid solution D | Polyamide acid solution D |
| Thickness of polyimide film | μm | 26 | 22 |
| CTE of polyimide film | ppm/° C. | 8.2 | 16 |
| Inorganic layer used |  | Treated inorganic layer 2 | Treated inorganic layer 2 |
| UV light irradiation |  | Absence | Absence |
| Peel strength Good adhesion parts | 3.6 | 3.6 | 7.0 |
| Peel strength Easily peeling parts | 3.6 | 3.6 | 7.0 |
| Warp of polyimide film | mm | 0.5 | 0.7 |
| Name |  | Laminate 15 | Laminate 16 |

Example 15

A laminate 17 and a polyimide film 12 were obtained in the completely same manner as in Example 1, except that the inorganic layer was changed to the treated inorganic layer 1, the gap of the applicator was adjusted so that the thickness of the polyimide layer was 25 μm, and the polyamide acid solution was changed to the polyamide acid solution a. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 11.

Example 16

A laminate 18 and a polyimide film 13 were obtained in the completely same manner as in Example 1, except that the inorganic layer was changed to the treated inorganic layer 2, the gap of the applicator was adjusted so that the thickness of the polyimide layer was 10 μm, and the polyamide acid solution was changed to the polyamide acid solution a. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 11.

Example 17

A laminate 19 and a polyimide film 14 were obtained in the completely same manner as in Example 1, except that the inorganic layer was changed to the treated inorganic layer 3, the gap of the applicator was adjusted so that the thickness of the polyimide layer was 30 μm, and the polyamide acid solution was changed to the polyamide acid solution a. The surface roughness (Ra) in the UV non-irradiated part of the inorganic layer surface (SC layer surface) after the UV irradiation treatment was 0.4 nm, and the surface roughness (Ra) in the UV non-irradiated part was 0.3 nm. The evaluation results of the obtained laminate are shown in Table 11.

Example 18

A laminate 20 and a polyimide film 15 were obtained in the completely same manner as in Example 1, except that the inorganic layer was changed to the treated inorganic layer 2, the gap of the applicator was adjusted so that the thickness of the polyimide layer was 20 μm, and the polyamide acid solution was changed to the polyamide acid solution b. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 11.

Example 19

A laminate 21 and a polyimide film 16 were obtained in the completely same manner as in Example 1, except that the inorganic layer was changed to the treated inorganic layer 2, the gap of the applicator was adjusted so that the thickness of the polyimide layer was 15 µm, and the polyamide acid solution was changed to the polyamide acid solution d. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 11.

Example 20

A laminate 22 and a polyimide film 17 were obtained in the completely same manner as in Example 1, except that the inorganic layer was changed to the treated inorganic layer 1, the gap of the applicator was adjusted so that the thickness of the polyimide layer was 20 µm, and the polyamide acid solution was changed to the polyamide acid solution e. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 12.

Example 21

A laminate 23 and a polyimide film 18 were obtained in the completely same manner as in Example 1, except that the inorganic layer was changed to the treated inorganic layer 2, the gap of the applicator was adjusted so that the thickness of the polyimide layer was 25 µm, and the polyamide acid solution was changed to the polyamide acid solution e. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 12.

Example 22

A laminate 24 and a polyimide film 19 were obtained in the completely same manner as in Example 1, except that the inorganic layer was changed to the treated inorganic layer 1, the gap of the applicator was adjusted so that the thickness of the polyimide layer was 25 µm, and the polyamide acid solution was changed to the polyamide acid solution c. The surface roughness (Ra) in the UV non-irradiated part of the inorganic layer surface (SC layer surface) after the UV irradiation treatment was 0.4 nm, and the surface roughness (Ra) in the UV non-irradiated part was 0.4 nm. The evaluation results of the obtained laminate are shown in Table 12.

Example 23

A laminate 25 and a polyimide film 20 were obtained in the completely same manner as in Example 1, except that the inorganic layer was changed to the treated inorganic layer 1, the gap of the applicator was adjusted so that the thickness of the polyimide layer was 25 µm, and the polyamide acid solution was changed to the polyamide acid solution f. The surface roughness (Ra) in the UV non-irradiated part of the inorganic layer surface (SC layer surface) after the UV irradiation treatment was 0.4 nm, and the surface roughness (Ra) in the UV non-irradiated part was 0.5 nm. The evaluation results of the obtained laminate are shown in Table 12.

TABLE 11

| | | Unit | Example 15 | Example 16 | Example 17 | Example 18 | Example 19 |
|---|---|---|---|---|---|---|---|
| Solution used | | | Polyamide acid solution a | Polyamide acid solution a | Polyamide acid solution a | Polyamide acid solution b | Polyamide acid solution d |
| Thickness of polyimide layer | | µm | 25 | 9 | 30 | 20 | 15 |
| CTE of polyimide layer | | ppm/° C. | 1.2 | 1.2 | 1.2 | 11 | 4.1 |
| Inorganic layer used | | | Treated inorganic layer 1 | Treated inorganic layer 2 | Treated inorganic layer 3 | Treated inorganic layer 2 | Treated inorganic layer 2 |
| Peel strength | Good adhesion parts | N/cm | 4.3 | 7.2 | 2.1 | 7.1 | 7.0 |
| | Easily peeling parts | N/cm | 0.1 | 0.5 | 0.2 | 0.3 | 0.4 |
| Warp of polyimide layer | | mm | 0.5 | 0.5 | 0.5 | 1.0 | 0.5 |
| Name | | | Laminate 17 | Laminate 18 | Laminate 19 | Laminate 20 | Laminate 21 |

TABLE 12

| | Unit | Example 20 | Example 21 | Example 22 | Example 23 |
|---|---|---|---|---|---|
| Solution used | | Polyamide acid solution e | Polyamide acid solution e | Polyamide acid solution c | Polyamide acid solution f |
| Thickness of polyimide layer | µm | 19 | 26 | 24 | 25 |
| CTE of polyimide layer | ppm/° C. | 4.0 | 4.0 | 57 | 39 |

TABLE 12-continued

|  | Unit | Example 20 | Example 21 | Example 22 | Example 23 |
|---|---|---|---|---|---|
| Inorganic layer used |  | Treated inorganic layer 1 | Treated inorganic layer 2 | Treated inorganic layer 2 | Treated inorganic layer 2 |
| Peel strength Good adhesion parts | N/cm | 7.0 | 7.2 | 7.1 | 7.5 |
| Easily peeling parts | N/cm | 0.4 | 0.5 | 0.5 | 0.4 |
| Warp of polyimide layer | mm | 0.5 | 0 | 10 | 5.0 |
| Name |  | Laminate 17 | Laminate 18 | Laminate 19 | Laminate 20 |

Comparative Example 7

A laminate 26 and a polyimide film 21 were obtained in the completely same manner as in Example 15, except that the inorganic layer was changed to untreated glass (Corning EAGLE XG 100 mm×100 mm, 0.7 mm thickness). The evaluation results of the obtained laminate are shown in Table 13.

Comparative Example 8

A laminate 27 and a polyimide film 22 were obtained in the completely same manner as in Example 15, except that the inorganic layer was changed to untreated silicon wafer (diameter 20 cm, 0.725 mm thickness). The evaluation results of the obtained laminate are shown in Table 13.

Comparative Example 9

A laminate 28 was obtained in the completely same manner as in Example 15, except that no UV irradiation treatment was carried out for the inorganic layer. The evaluation results of the obtained laminate are shown in Table 13.

Comparative Example 10

A laminate 29 was obtained in the completely same manner as in Example 15, except that the inorganic layer was changed to the treated inorganic layer 2 and no UV irradiation treatment was carried out for the inorganic layer. The evaluation results of the obtained laminate are shown in Table 13

TABLE 13

|  | Unit | Comparative Example 7 | Comparative Example 8 | Comparative Example 9 | Comparative Example 10 |
|---|---|---|---|---|---|
| Solution used |  | Polyamide acid solution a | Polyamide acid solution a | Polyamide acid solution a | Polyamide acid solution a |
| Thickness of polyimide layer | μm | 25 | 24 | 23 | 24 |
| CTE of polyimide layer | ppm/° C. | 1.2 | 1.2 | 1.3 | 1.2 |
| Inorganic layer used |  | Glass | Silicon wafer | Treated inorganic layer 1 | Treated inorganic layer 2 |
| UV light irradiation |  | Presence | Presence | Absence | Absence |
| Peel strength Good adhesion parts | N/cm | 0.1 | 0.4 | 3.1 | 6.8 |
| Easily peeling parts | N/cm | 0.1 | 0.4 | 3.1 | 6.8 |
| Warp of polyimide layer | Mm | 0.5 | 0.5 | 5.0 | 5.0 |
| Name |  | Laminate 17 | Laminate 18 | Laminate 19 | Laminate 20 |

Measurement Examples 1 to 5

Five sheets of a silicon wafer cut into a size of 50 mm×50 mm (□50 mm) were prepared and used as an inorganic layer (basal plate), and the respective sheets were washed by ultrasonic washing with pure water for 5 minutes, ultrasonic washing with ethanol for 5 minutes, and ultrasonic washing with pure water for 5 minutes, thereafter set on a spin coater, coated with isopropyl alcohol spread by spinning at 1000 rpm and dried, successively, coated with a silane coupling agent in the same manner as in Inorganic Layer Treatment Example 1, and heated by a hot plate at 110° C. to form a coupling agent treatment layer with a thickness of 11 mm. Thereafter, the surface of the coupling agent treatment layer was subjected to UV irradiation to give samples obtained by UV light irradiation for 0 seconds, 10 seconds, 30 seconds, 120 seconds, and 1800 seconds. The surface composition ratio at this time is shown in Table 14.

formed; however, it is supposed that a functional group such as an aldehyde group, a carboxyl group, or a carboxylic acid group is produced from an alkyl group by UV irradiation treatment, and therefore the UV irradiation parts became good adhesion parts.

Application Example

Each laminate obtained in Example 5 and Comparative Example 2 was fixed on a basal plate holder in a sputtering apparatus while a stainless frame having an aperture part was set thereon. The basal plate holder and the inorganic layer was fixed so as to be stuck with each other, and a cooling medium was led to the basal plate holder to make it possible to set the temperature of the film, and the temperature of the polyimide layer of the laminate was set to 2° C. Then, plasma treatment was carried out for the surface of the polyimide layer. The plasma treatment conditions were set

TABLE 14

|  | Measurement Example 1 | Measurement Example 2 | Measurement Example 3 | Measurement Example 4 | Measurement Example 5 |
|---|---|---|---|---|---|
| Thickness of SC layer (nm) | 11 | 11 | 11 | 11 | 11 |
| UV irradiation time (sec) | 0 | 10 | 30 | 120 | 1800 |
| Atomic Percentage C (%) | 47 | 44 | 38 | 17 | 4 |
| Atomic Percentage N (%) | 10 | 7 | 6 | 2 | 0.1 |
| Atomic Percentage O (%) | 24 | 32 | 37 | 53 | 59 |
| Atomic Percentage Si (%) | 19 | 18 | 19 | 28 | 37 |
| Nitrogen surface composition ratio (%) | 100 | 67 | 58 | 22 | 0.1 |

In the case where 3-aminopropyltrimethoxysilane having a functional group was applied to the silicon wafer, the parts which were not subjected to the UV irradiation treatment became good adhesion parts and the UV irradiation treatment parts became easily peeling parts (Example 1). It has been known that ozone and active oxygen are generated if UV irradiation treatment is carried out, and from Measurement Examples 1 to 5, the atomic percent of nitrogen (N) element is lowered and successively that of carbon (C) is also lowered, and it is implied that an aminopropyl group is decomposed by UV irradiation treatment. The adhesion strength is improved by carrying out functional group-containing coupling agent treatment so that the good adhesion parts are formed, and it is supposed that reaction by ozone or active oxygen atoms is promoted by UV irradiation treatment, an aminopropyl group is decomposed, the adhesion strength between the inorganic layer and the polyimide layer is lowered, and thus the easily peelable property is observed.

On the other hand, in the case where those having no functional group such as n-propyltrimethoxysilane were applied to the inorganic layer, the parts which were not subjected to the UV irradiation treatment became easily peeling parts and the UV irradiation parts became good adhesion parts (Example 3). From Measurement Examples 1 to 5, oxygen (O) is increased by UV irradiation treatment and it is implied that the propyl group parts are oxidized. The adhesion strength of the polyimide layer to an alkyl group such as a propyl group is low so that easily peeling parts are to, in argon gas, a frequency of 13.56 MHz, an output of 200 W, and a gas pressure of $1 \times 10^{-3}$ Torr; the temperature at the time of treatment was 2° C., and the treatment time was 2 minutes. Next, using a nickel-chromium (chromium 10 mass %) alloy as a target, a 7 nm thick nickel-chromium alloy coating (underlayer) was formed by a DC magnetron sputtering method at 1 nm/second rate in an argon atmosphere under the conditions of a frequency of 13.56 MHz, an output of 450 W, and a gas pressure of $3 \times 10^{-3}$ Torr. Further, the temperature of the polyimide layer of the laminate was set to 2° C. by bringing the back surface of the basal plate to the sputtered surface into contact with the SUS plate of the basal plate holder to which the cooling medium controlled at a temperature of 2° C. was led, and the sputtering was carried out. Copper was vapor deposited at 10 nm/second rate to form a 0.25 μm-thick thin copper film. A laminate bearing a metal thin film-formed film as an underlayer was obtained from each film. The thickness of the copper film and that of the NiCr layer were confirmed by a fluorescent x-ray analysis.

After that, each laminate bearing a metal thin film-formed film as an underlayer produced from each laminate was fixed in a frame made of Cu, and a thick copper layer was formed using a copper sulfate plating bath. Electrolytic plating conditions were set to, by immersing in an electrolytic plating solution (80 g/L copper sulfate, 210 g/L sulfuric acid, HCl, and a small amount of a brightening agent), and by applying electric power at 1.5 Adm$^2$. Thus, a thick copper plating layer (thick layer) with 4 μm thickness was formed.

Successively, the laminate was heated at 120° C. for 10 minutes, followed by drying, to obtain a metalized laminate.

After applying a photoresist ("FR-200", manufactured by Shipley) to each obtained metalized laminate, followed by drying, the photoresist was exposed through a closely set glass photomask and developed with an aqueous 1.2 mass % KOH solution. Next, etching was carried out at 40° C. and 2 kgf/cm$^2$ spray pressure along an etching line of a cupric chloride containing HCl and hydrogen peroxide to form lines of line/space=20 µm/20 µm as a test pattern. Next, after electroless tin plating with 0.5 µm thickness was performed, annealing treatment was carried out at 125° C. for 1 hour. A dripping, pattern residues, and pattern peeling in the formed pattern were observed with an optical microscope to evaluate the pattern from the resin layer.

In the case where the resin film laminate of Example 5 was used, a good pattern free from smear, pattern residues, and pattern peeling was obtained. Further, even if this laminate was heated to 400° C. at a temperature rising speed of 10° C./minute in a muffle furnace replaced with nitrogen, retained at 400° C. for 1 hour, and spontaneously allowed to cool, no blister, peeling or the like occurred.

Further, even if the resulting resin film was peeled from the inorganic layer, no pattern peeling or the like occurred. Accordingly, a wiring pattern-bearing resin film was obtained.

In the case where the resin film laminate of Comparative Example 2 was used, film peeling, smear, pattern residues, and pattern peeling were observed, and no good pattern was obtained.

Application Example 2

Figure 4:
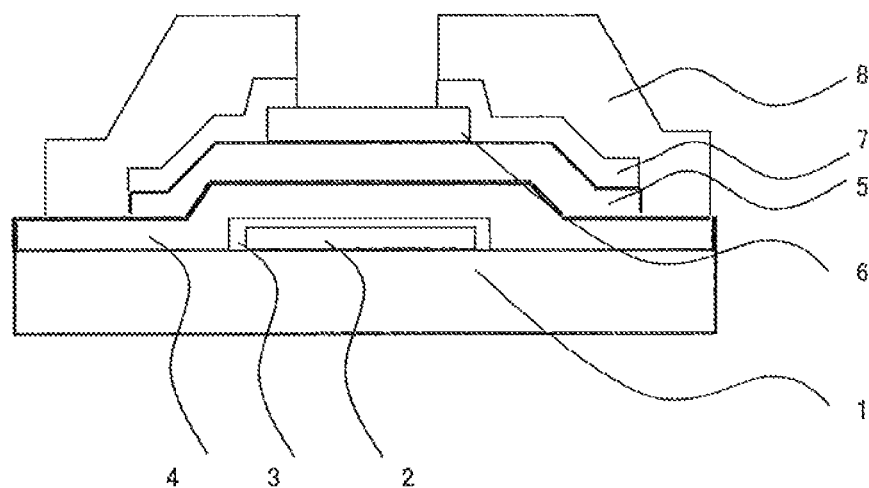
FIG. 4(1) is a cross-sectional view and FIG. 4(2) is a top view showing a display apparatus (display panel) as one example of a device structure.
Figure 4:
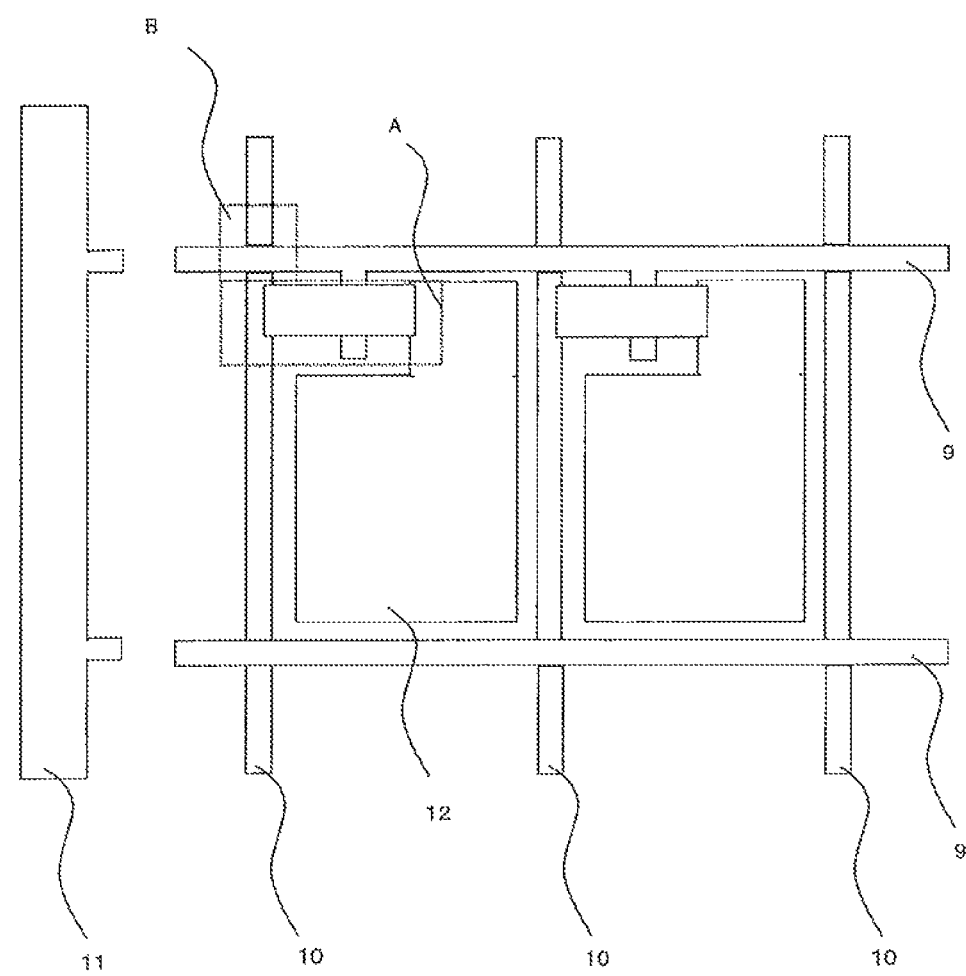

A TFT basal plate was fabricated as a fabrication example of a display apparatus (display panel), which is one example of a device structure of the present invention. FIG. 4(a) shows a schematic cross-sectional view of the TFT basal plate and FIG. 4(b) shows its top view, respectively.

The laminate of the present invention obtained in Example 1 was used as a basal plate 101, Al (aluminum) 102 was pattern-wise deposited in 200 nm thickness on a polyimide layer of the laminate by sputtering, and a gate wiring bus line 111, a gate electrode (not illustrated), and gate wrings 109 were formed. At this time, the respective gate wirings 109 were connected to the gate wiring bus line 111, and this gate wiring bus line 111 was used as a power supply line at the time of anodization. Next, photoresist was applied in 3 µm thickness, and the resist was removed from the TFT part (region A) and the wiring crossing part (region B) by photoetching process. In this state, the entire body of the basal plate 101 was immersed in a chemical conversion liquid (a liquid obtained by diluting a 3% tartaric acid solution with ethylene glycol and adjusting pH to 7.0 with the addition of ammonia water), and the Al of 70 nm thickness in the regions A and B was changed to $Al_2O_3$ by applying a voltage of +72 V for 30 minutes to the gate wiring bus line 111, and thus an $Al_2O_3$ film (anodization film) with about 100 nm thickness was formed. After the resist was removed, the basal plate was heated at 200° C. for 1 hour in atmospheric air to lower electric current leakage of the $Al_2O_3$ film. Next, a first silicon nitride film 104 with a 300 nm thickness was formed on the $Al_2O_3$ film by a plasma CVD method, and successively a hydrogenated amorphous silicon film (a-Si) 105 with a 100 nm thickness and a second silicon nitride film 106 with a 200 nm thickness were formed. At this time, the temperature of the basal plate 101 was adjusted to 380° C. Thereafter, the second silicon nitride film 106 was patterned to be left only the wiring crossing part on the channel of the TFT. Then, after an n-type amorphous silicon layer 107 doped with about 2% phosphorus was deposited in 50 nm thickness and patterned to leave the layer on the source/drain part of the TFT. At this time, the hydrogenated amorphous silicon (a-Si) 105 was simultaneously removed. Next, Cr (chromium) in 100 nm thickness and Al (aluminum) in 500 nm thickness were deposited by sputtering to form a Cr/Al layer 108 and then patterned to form a signal line 110, drain and source wiring (not illustrated) of the TFT, and the like. Herein, the previously formed gate wiring bus line 111 was removed to separate respective gate wirings 109. Thereafter, ITO in 100 nm thickness as a transparent electrode 112 was formed by sputtering to form pixel electrode, terminals or the like, and finally silicon nitride in about 1 µm thickness was deposited by plasma CVD and the silicon nitride on the terminal part was removed by photo-etching process.

Then, a protection film made of a polyester film base was stuck to the UV irradiation part of the polyimide layer, a notch was formed in the boundary of the UV irradiation area and the UV non-irradiated area, the TFT part formed in the UV irradiation area was removed to obtain a TFT basal plate.

Figure 5:
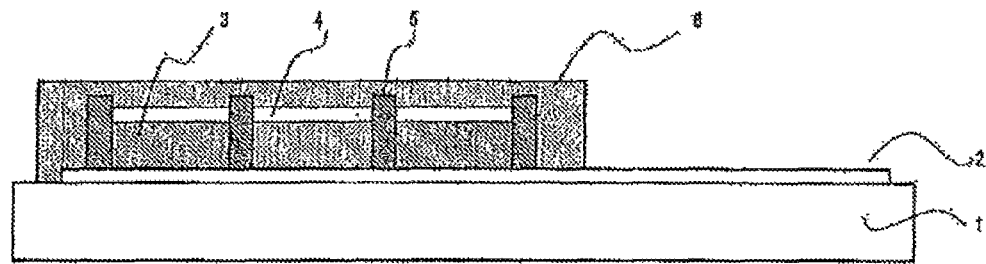
FIG. 5 is a cross-sectional view showing a display apparatus (display panel) as another example of a device structure.

A display apparatus using an organic EL device was fabricated as a fabrication example of a display apparatus (display panel), which is one example of a device structure of the present invention. FIG. 5 shows a schematic cross-sectional view of the display apparatus using an organic EL device.

First, the laminate of the present invention obtained in Example 1 was used as a basal plate 201, a first electrode 202 as a pixel electrode was formed on a polyimide layer of the laminate by sputtering molybdenum, and thereafter, a light emitting layer 203 was formed on the first electrode 202. After a partitioning wall 206 was formed on the first electrode 202, the light emitting layer 203 was formed by printing an un-doped organic layer containing poly(p-phenylene-vinylene) as a light emitting substance with the use of a screen printing method. The highest reaching temperature at drying of the layer in this time was 180° C. Next, ITO was sputtered to form a second electrode 204 on the light emitting layer 203; thereafter, a fluoro resin layer was formed as a protection film 206 by coating; a notch was formed in the boundary of the UV irradiation part and the UV non-irradiated part of the polyimide film in the same manner as in Application Example 2; and the light emitting part was peeled together with the polyimide film from the laminate to fabricate a display apparatus (self-emission type display apparatus) using an organic EL device. The highest reaching temperature of the heat applied to the basal plate (laminate) during the above-mentioned fabrication process was 350° C. At this time, the basal plate temperature is increased to 350° C. (FIG. 5).

When alternating voltage of peak-to-peak 60 V and 1000 Hz was applied to the display apparatus using an organic EL device produced by using the laminate of Example 1, clear green light was emitted.

Display apparatuses using organic EL devices, which were produced by using the laminates of other Examples, were respectively fabricated in the same manner as described above, and when a voltage was applied in the same manner as described above, good light emission was achieved in all cases. In contrast, display apparatuses using organic EL devices, which were produced by using the laminates of respective Comparative Examples, were fabricated in the same manner as described above, and when a voltage was applied in the same manner as described above, no sufficient light emission was obtained. It is supposedly attributed to that the plane retention property at high temperature of the polyimide layer of each laminate is deteriorated and becomes inferior by increase and decrease of temperature due to the heat loaded during the fabrication process of the display apparatus, and thus the conductive layer, particularly, the transparent layer, is damaged.

Example 24

A glass plate (Corning EAGLE XG 650 mm×830 mm, 0.7 mm thickness) as an inorganic layer was submerged in a solution of 0.2 wt % isopropyl alcohol in n-propyltrimethoxysilane stored in a container and pulled up at 10 mm per second to a space replaced with nitrogen and simultaneously drained by blowing dry nitrogen gas with an air knife. Next, the glass plate was placed in a dry oven at 120° C. replaced with dry nitrogen for 15 minutes, and these steps were carried out as silane coupling agent treatment. In the case where a silicon wafer was treated in the same application conditions, the thickness of the silane coupling agent layer measured by ellipsometry was 40 nm.

A metal mask made of stainless steel and having shielding parts with 5 mm width arranged in an array-like state alternately with a rectangular opening of 68 mm×110 mm was laminated on the obtained glass plate subjected to the coupling agent treatment, and after it was confirmed that there was no gap between the metal mask and the glass plate, atmospheric pressure plasma treatment was carried out as patterning treatment by an atmospheric pressure plasma treatment apparatus using a gas mixture of nitrogen 95/oxygen 5 in a flow rate ratio. The atmospheric pressure plasma treatment apparatus had a mechanism for automatically moving a slit-like transversely long head on a work, and the duration when the glass plate was exposed to the plasma was approximately 45 seconds. The surface roughness (Ra) in the treated part of the inorganic layer surface (SC layer surface) after the treatment was 0.5 nm and the surface roughness (Ra) in the untreated part was 0.4 nm.

Next, the polyamide acid solution a obtained in Synthesis Example 10 was applied by using a die coater, and the resulting glass plate was dried at 80° C. for 30 minutes and at 100° C. for 90 minutes in a dry oven in which dry nitrogen gas flowed, transferred to an inert heat treatment furnace replaced with nitrogen, heated to 200° C. from 100° C. at a temperature rising speed of 5° C./minute, retained at the temperature for 30 minutes, heated to 450° C. at 5° C./minute, retained at 450° C. for 1 minute, and thereafter cooled to room temperature at 20° C./minute to obtain a laminate. The thickness of the polyimide layer of the laminate was 21 μm.

The 180-degree peel strength of the polyimide layer in the masked part of the obtained laminate was 2.8 N/cm. On the other hand, the 180-degree peel strength in the non-masked part was 0.67 N/cm.

As simulation process for producing a thin film transistor array using low temperature polysilicon on the obtained laminate plate, a silicon oxide layer as a leveling layer which also serves as a gas barrier layer by a reactive sputtering method, a tantalum layer and a barrier metal layer as source/drain electrode layers by a sputtering method, and an amorphous silicon layer as a semiconductor layer by a CVD method were laminated and annealed at 400° C. for 75 minutes to make the silicon layer polycrystalline, and thereafter a SiN layer as a gate insulating layer and aluminum as a gate electrode layer were layered. The respective layers were patterned by masking or photolithography corresponding to prescribed test patterns to give a simulation device: a thin film transistor array. A device part was formed in each opening part of the metal mask at the time of patterning treatment. During the above-mentioned process, the laminate plate was exposed to a resist liquid, a development liquid, an etching liquid, and a releasing liquid used for the photolithography under vacuum atmosphere and high temperature, but the polyimide layer was not peeled from the glass layer and the process suitability was excellent.

Next, a notch was formed in the polyimide layer along the boundary between the shielding part and the opening part of the mask corresponding to the pattern of the metal mask used for the patterning treatment, and the part where the device was formed was peeled. The peeling was carried out easily by slightly lifting up the rim part with a blade. The peeling was tried similarly for the shielded parts with 5 mm width; however, the peeling of the polyimide layer without breakage was difficult.

Example 25

A simulation process experiment for producing a thin film transistor array using low temperature polysilicon was carried out in the same manner as in Example 24, except that the silane coupling agent treatment was changed to a spin coating method and the atmospheric pressure plasma treatment was changed to blast treatment.

The silane coupling agent treatment by a spin coater was carried out by the following procedure. A glass plate (Corning EAGLE XG 300 mm×300 mm, 0.7 mm thickness) was mounted on a spin coater manufactured by Japancreate Co., Ltd., and the glass plate was coated with a 0.1 wt % isopropyl alcohol solution using n-propyltrimethoxysilane as a silane coupling agent, and then, the glass plate was dried and heated at 100° C. for 10 minutes in a dry oven replaced with dry nitrogen. In the case where a silicon wafer was treated in the same application conditions, the thickness of the silane coupling agent layer measured by ellipsometry was 40 nm.

The blast treatment was carried out by using a compact wet blast treatment apparatus manufactured by Macoho Co., Ltd., water as a medium, and #2000 silica particles as an abrasive material. The blast was carried out through a mask and on completion of the blast, the glass plate was rinsed with ultrapure water and dried by dry air and then transported to the next step, that is, the step of applying a polyamide acid solution by a die coater. The surface roughness (Ra) in the treated part of the inorganic layer surface (SC layer surface) after the treatment and before the application step was 0.6 nm, and the surface roughness (Ra) in the untreated part was 0.5 nm.

As a result, the 180-degree peel strength of the polyimide layer in the masked part of the obtained laminate was 3.3 N/cm. On the other hand, the 180-degree peel strength in the non-masked part was 1.23 N/cm. There was no problem in the property of pursuing processes and the peeling property of the weakly adhesive part was also good.

Example 26

A simulation process experiment for producing a thin film transistor array using low temperature polysilicon was carried out in the same manner as in Example 24, except that the silane coupling agent treatment was changed to the spin coating method as described in Example 25, the polyamide acid solution was changed to the polyamide acid solution b obtained in Synthesis Example 11, and the atmospheric pressure plasma treatment was changed to vacuum plasma treatment.

The vacuum plasma treatment was carried out using an apparatus for glass sheets by setting a glass plate in the apparatus while layering a metal mask on the surface of the glass plate treated with a silane coupling agent, vacuum-evacuating the apparatus until the pressure of the vacuum chamber became 1×10−3 Pa or lower, introducing argon gas into the vacuum chamber, and treating the glass plate surface with argon gas plasma for 20 seconds under conditions of a discharge electric power of 100 W and a frequency of 15 kHz. The surface roughness (Ra) in the treated part of the inorganic layer surface (SC layer surface) after the treatment was 0.6 nm, and the surface roughness (Ra) in the untreated part was 0.5 nm. Hereinafter, the glass plate was transported to the next step, that is, the step of applying the polyamide acid solution by a die coater, and underwent prescribed process. As a result, the 180-degree peel strength of the polyimide layer in the masked part of the obtained laminate was 3.1 N/cm. On the other hand, the 180-degree peel strength in the non-masked part was 0.91 N/cm. There was no problem in the property of pursuing processes and the peeling property of the weakly adhesive part was also good.

Example 27

A simulation process experiment for producing a thin film transistor array using low temperature polysilicon was carried out in the same manner as in Example 24, except that the silane coupling agent treatment was changed to the spin coating method as described in Example 25, and the atmospheric pressure plasma treatment was changed to corona treatment.

Using a corona treatment apparatus manufactured by Kasuga Electric Works Ltd., treatment was carried out with a discharge magnitude of 10 W/m$^2$/minute by applying 1000 W electric power. In this experiment, an acrylic plate with a 0.5 mm thickness and processed to have the same shape as that of the metal mask was used in place of the metal mask. The surface roughness (Ra) in the treated part of the inorganic layer surface (SC layer surface) after the treatment was 0.6 nm, and the surface roughness (Ra) in the untreated part was 0.5 nm. Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.6 N/cm. On the other hand, the 180-degree peel strength in the non-masked part was 1.5 N/cm. There was no problem in the property of pursuing processes and the peeling property of the weakly adhesive part was also good.

Example 28

A simulation process experiment for producing a thin film transistor array using low temperature polysilicon was carried out in the same manner as in Example 24, except that the silane coupling agent treatment was changed to the spin coating method as described in Example 25, the polyamide acid solution was changed to the polyamide acid solution c obtained in Synthesis Example 12, and the atmospheric pressure plasma treatment was changed to electron beam irradiation treatment as one kind of active radiation treatment.

Using Min-EB apparatus (manufactured by TOYO INK CO., LTD.) as an electron beam irradiation apparatus, 10 kGy energy was radiated by accelerating voltage of 30 kV. In this experiment, an acrylic plate with a 0.5 mm thickness and processed to have the same shape as that of the metal mask was used in place of the metal mask. The surface roughness (Ra) in the treated part of the inorganic layer surface (SC layer surface) after the treatment was 0.6 nm, and the surface roughness (Ra) in the untreated part was 0.5 nm. Hereinafter, the glass plate was transported to the next step, that is, the step of applying the polyamide acid solution by a die coater, and underwent prescribed process. As a result, the 180-degree peel strength of the polyimide layer in the masked part of the obtained laminate was 3.4 N/cm. On the other hand, the 180-degree peel strength in the non-masked part was 0.97 N/cm. There was no problem in the property of pursuing processes and the peeling property of the weakly adhesive part was also good.

Example 29

A simulation process experiment for producing a thin film transistor array using low temperature polysilicon was carried out in the same manner as in Example 24, except that the silane coupling agent treatment was changed to the spin coating method as described in Example 25, the coupling agent was changed to 3-aminopropyltrimethoxysilane, the polyamide acid solution was changed to the polyamide acid solution e obtained in Synthesis Example 14, and the atmospheric pressure plasma treatment was changed to active gas (chlorine gas) treatment.

The active gas treatment using chlorine gas was carried out by the following procedure. The treatment was carried out by firstly setting glass subjected to silane coupling agent treatment in a chamber in which pressure could be reduced while layering a metal mask on the glass; introducing a mixture gas of 95% nitrogen gas and 5% chlorine gas into the chamber; stopping the chlorine gas supply after the chamber was filled with the mixture gas at 1 atm theoretically based on flow rate and retained for 30 seconds in this state; stopping the nitrogen gas supply after continuous nitrogen gas supply for 60 seconds; reducing the pressure in the chamber again; returning the pressure to normal pressure with dry air; repeating the pressure reduction and recovery of the pressure to normal pressure again; and taking out the glass plate. The surface roughness (Ra) in the treated part of the inorganic layer surface (SC layer surface) after the treatment was 0.6 nm, and the surface roughness (Ra) in the untreated part was 0.5 nm.

Hereinafter, the glass plate was transported to the next step, that is, the step of applying the polyamide acid solution by a die coater, and underwent prescribed process. As a result, the 180-degree peel strength of the polyimide layer in the masked part of the obtained laminate was 3.0 N/cm. On the other hand, the 180-degree peel strength in the non-masked part was 0.8 N/cm. There was no problem in the property of pursuing processes and the peeling property of the weakly adhesive part was also good.

Example 30

A simulation process experiment for producing a thin film transistor array using low temperature polysilicon was carried out in the same manner as in Example 24, except that the silane coupling agent treatment was changed to the spin coating method as described in Example 25, the polyamide acid solution was changed to the polyamide acid solution b obtained in Synthesis Example 11, and the atmospheric pressure plasma treatment was changed to active gas (ozone gas) treatment.

The active gas treatment using ozone was carried out by the following procedure. The treatment was carried out by firstly setting glass subjected to silane coupling agent treatment in a chamber in which pressure could be reduced while layering a metal mask on the glass; reducing the pressure in the chamber; introducing ozone gas from an ozonizer (PSA ozonizer SGA-01-PSA 2, manufactured by Sumitomo Precision Products Co., Ltd.); stopping the ozone gas supply after the chamber was filled with the mixture gas at 1 atm theoretically based on flow rate and retained for 60 seconds in this state; reducing the pressure in the chamber again; returning the pressure to normal pressure with dry air; repeating the pressure reduction and recovery of the pressure to normal pressure again; and taking out the glass plate. The surface roughness (Ra) in the treated part of the inorganic layer surface (SC layer surface) after the treatment was 0.6 nm, and the surface roughness (Ra) in the untreated part was 0.5 nm.

Hereinafter, the glass plate was transported to the next step, that is, the step of applying the polyamide acid solution by a die coater, and underwent prescribed process. As a result, the 180-degree peel strength of the polyimide layer in the masked part of the obtained laminate was 2.8 N/cm. On the other hand, the 180-degree peel strength in the non-masked part was 1.2 N/cm. There was no problem in the property of pursuing processes and the peeling property of the weakly adhesive part was also good.

Example 31

A simulation process experiment for producing a thin film transistor array using low temperature polysilicon was carried out in the same manner as in Example 24, except that the silane coupling agent treatment was changed to the spin coating method as described in Example 25, the coupling agent was changed to 3-aminopropyltrimethoxysilane, and the atmospheric pressure plasma treatment was changed to chemical liquid treatment (hydrogen peroxide treatment).

The chemical liquid treatment was carried out by the following procedure. As the chemical liquid, 5% hydrogen peroxide water was used. A polyimide pressure-sensitive adhesive tape (silicone resin was used for pressure-sensitive adhesive) slit in 5 mm width was used in place of the metal mask and stuck to the glass plate surface subjected to the coupling agent treatment so as to have the same shape as that of the metal mask. The masked glass plate was mounted on a spray type etching apparatus, etched by spraying hydrogen peroxide water for 5 minutes, rinsed with ultrapure water, dried, and thereafter the polyimide tape used in place of the mask was peeled after drying. The surface roughness (Ra) in the treated part of the inorganic layer surface (SC layer surface) after the treatment was 0.6 nm, and the surface roughness (Ra) in the untreated part was 0.5 nm.

Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.1 N/cm. On the other hand, the 180-degree peel strength in the non-masked part was 0.8 N/cm. There was no problem in the property of pursuing processes and the peeling property of the weakly adhesive part was also good.

Example 32

A simulation process experiment for producing a thin film transistor array using low temperature polysilicon was carried out in the same manner as in Example 24, except that the silane coupling agent treatment was changed to the spin coating method as described in Example 25, the coupling agent was changed to 3-aminopropyltrimethoxysilane, and the atmospheric pressure plasma treatment was changed to chemical liquid treatment (sulfuric acid treatment). The surface roughness (Ra) in the treated part of the inorganic layer surface (SC layer surface) after the treatment was 0.6 nm, and the surface roughness (Ra) in the untreated part was 0.5 nm.

The chemical liquid treatment was carried out by the following procedure. An aqueous 50% sulfuric acid solution was used as the chemical liquid. A polyimide pressure-sensitive adhesive tape (silicone resin was used for pressure-sensitive adhesive) slit in 5 mm width was used in place of the metal mask and stuck to the glass plate surface subjected to the coupling agent treatment so as to have the same shape as that of the metal mask. The glass plate was immersed in a treatment layer filled with the chemical liquid, moderately shaken for 3 minutes, pulled up, and thereafter rinsed with ion-exchanged water and then with ultrapure water, and the polyimide tape used in place of the mask was peeled after drying.

Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.3 N/cm. On the other hand, the 180-degree peel strength in the non-masked part was 0.5 N/cm. There was no problem in the property of pursuing processes and the peeling property of the weakly adhesive part was also good.

Example 33

A simulation process experiment for producing a thin film transistor array using low temperature polysilicon was carried out in the same manner as in Example 24, except that the silane coupling agent treatment was changed to the spin coating method as described in Example 25, the coupling agent was changed to 3-aminopropyltrimethoxysilane, and the atmospheric pressure plasma treatment was changed to chemical liquid treatment (hydrochloric acid treatment).

The chemical liquid treatment was carried out by the following procedure. As the chemical liquid, 35% hydrochloric acid was used. A polyimide pressure-sensitive adhesive tape (silicone resin was used for pressure-sensitive adhesive) slit in 5 mm width was used in place of the metal mask and stuck to the glass plate surface subjected to the coupling agent treatment so as to have the same shape as that of the metal mask. The glass plate was immersed in a treatment layer filled with the chemical liquid, moderately shaken for 3 minutes, pulled up, and thereafter rinsed with ion-exchanged water and then with ultrapure water, and the polyimide tape used in place of the mask was peeled after drying. The surface roughness (Ra) in the treated part of the inorganic layer surface (SC layer surface) after the treatment was 0.6 nm, and the surface roughness (Ra) in the untreated part was 0.5 nm.

Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.2 N/cm. On the other hand, the 180-degree peel strength in the non-masked part was 0.7 N/cm. There was no problem in the property of pursuing processes and the peeling property of the weakly adhesive part was also good.

Example 34

A simulation process experiment for producing a thin film transistor array using low temperature polysilicon was carried out in the same manner as in Example 24, except that the silane coupling agent treatment was changed to the spin coating method as described in Example 25, the coupling agent was changed to 3-aminopropyltrimethoxysilane, and the atmospheric pressure plasma treatment was changed to chemical liquid treatment (hydrofluoric acid treatment).

The chemical liquid treatment was carried out by the following procedure. An aqueous 5% hydrofluoric acid solution was used as the chemical liquid. A polyimide pressure-sensitive adhesive tape (silicone resin was used for pressure-sensitive adhesive) slit in 5 mm width was used in place of the metal mask and stuck to the glass plate surface subjected to the coupling agent treatment so as to have the same shape as that of the metal mask. The glass plate was immersed in a treatment layer filled with the chemical liquid, moderately shaken for 3 minutes, pulled up, and thereafter rinsed with ion-exchanged water and then with ultrapure water, and the polyimide tape used in place of the mask was peeled after drying. The surface roughness (Ra) in the treated part of the inorganic layer surface (SC layer surface) after the treatment was 0.6 nm, and the surface roughness (Ra) in the untreated parts was 0.5 nm.

Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.0 N/cm. On the other hand, the 180-degree peel strength in the non-masked part was 0.4 N/cm. There was no problem in the property of pursuing processes and the peeling property of the weakly adhesive part was also good.

Example 35

A simulation process experiment for producing a thin film transistor array using low temperature polysilicon was carried out in the same manner as in Example 24, except that the silane coupling agent treatment was changed to the spin coating method as described in Example 25 and the atmospheric pressure plasma treatment was changed to direct drawing by laser light.

A YAG laser masking apparatus was used as a direct drawing apparatus by laser light, and patterning treatment was carried out by scanning the part corresponding to the opening of the metal mask with YAG laser light. The output power of the YAG laser was 1/10 of the power with which the marking on glass could be carried out. The surface roughness (Ra) in the treated part of the inorganic layer surface (SC layer surface) after the treatment was 0.6 nm, and the surface roughness (Ra) in the untreated part was 0.5 nm.

Hereinafter, the glass plate was transported to the next step, that is, the step of applying a polyamide acid solution by a die coater, and underwent prescribed process. As a result, the 180-degree peel strength of the polyimide layer in the masked part of the obtained laminate was 3.2 N/cm. On the other hand, the 180-degree peel strength in the non-masked part was 0.7 N/cm. There was no problem in the property of pursuing processes and the peeling property of the weakly adhesive part was also good.

Example 36

A glass plate (Corning EAGLE XG 370 mm×470 mm, 0.7 mm thickness) was subjected to spin coating using a solution of 0.2 wt % isopropyl alcohol in 3-aminopropyltrimethoxysilane.

The glass plate (Corning EAGLE XG 370 mm×470 mm, 0.7 mm thickness) was mounted on a spin coater for applying photoresist and the glass plate was subjected to spin coating of a 0.2 wt % isopropyl solution using 3-aminopropyltrimethoxysilane as a silane coupling agent, and dried and heated at 100° C. for 10 minutes in a dry oven set in clean environments. The thickness of a silane coupling agent layer measured by ellipsometry was 50 nm in the center part and 30 nm in the rim part. The surface roughness (Ra) in the treated part of the inorganic layer surface (SC layer surface) after the treatment was 0.6 nm, and the surface roughness (Ra) in the untreated part was 0.5 nm.

A metal mask made of stainless steel and having shielding parts with 5 mm width arranged in an array-like state alternately with a rectangular opening of 68 mm×110 mm was laminated on the obtained glass plate subjected to the coupling agent treatment, and after it was confirmed that there was no gap between the metal mask and the glass plate, atmospheric pressure plasma treatment was carried out as patterning treatment by an atmospheric pressure plasma treatment apparatus using a gas mixture of nitrogen 95/oxygen 5 in a flow rate ratio. The atmospheric pressure plasma treatment apparatus has a mechanism for automatically moving a slit-like transversely long head on a work, and the duration when the glass plate is exposed to the plasma is approximately 30 seconds.

Next, the polyamide acid solution a obtained in Synthesis Example 10 was applied by using a die coater, and the resulting glass plate was dried at 80° C. for 30 minutes and at 100° C. for 90 minutes in a dry oven in which dry nitrogen gas flowed, transferred to an inert heat treatment furnace replaced with nitrogen, heated to 200° C. from 100° C. at a temperature rising speed of 5° C./minute, retained at the temperature for 30 minutes, heated to 450° C. at 5° C./minute, retained at 450° C. for 1 minute, and thereafter cooled to room temperature at 20° C./minute to obtain a laminate. The thickness of the polyimide layer of the laminate was 23 µm.

The 180-degree peel strength of the polyimide layer in the masked part of the obtained laminate was 4.5 N/cm. On the other hand, the 180-degree peel strength in the non-masked part was 0.35 N/cm.

As simulation process for producing a thin film transistor array using low temperature polysilicon on the obtained laminate plate, a silicon oxide layer as a leveling layer which also serves as a gas barrier layer by a reactive sputtering method, a tantalum layer and a barrier metal layer as source/drain electrode layers by a sputtering method, and an amorphous silicon layer as a semiconductor layer by a CVD method were laminated and annealed at 420° C. for 40 minutes to make the silicon layer polycrystalline, and thereafter a SiN layer as a gate insulating layer and aluminum as a gate electrode layer were layered. The respective layers were patterned by masking or photolithography corresponding to prescribed test patterns to give a simulation device: a thin film transistor array. A device part was formed in each opening part of the metal mask at the time of patterning treatment. During the above-mentioned process, the laminate plate was exposed to a resist liquid, a development liquid, an etching liquid, and a releasing liquid used for the photolithography under vacuum atmosphere and high temperature, but the polyimide layer was not peeled from the glass layer and the process suitability was excellent.

Next, a notch was formed in the polyimide layer along the boundary between the shielding part and the opening part of the mask corresponding to the pattern of the metal mask used for the patterning treatment, and the part where the device was formed was peeled. The peeling was carried out easily by slightly lifting up the rim part with a blade. The peeling was tried similarly for the shielded parts with 5 mm width; however, the peeling of the polyimide layer without breakage was difficult.

INDUSTRIAL APPLICABILITY

A laminate obtained by the production method of the present invention is a laminate obtained by sticking one surface of an inorganic layer, which is one selected from a glass plate, a ceramic plate, a silicon wafer and a metal and a resin layer to each other without an adhesive layer interposed therebetween; and a device-bearing resin film obtained by the production method of the present invention is produced with the use of the laminate, and the device-bearing resin film is made by forming a notch in the resin layer of an easily peeling part and easily peeling the resin layer from the inorganic layer.

The laminate of the present invention is effectively usable in the process for producing a very fine circuit substrate and a device structure on an extremely thin resin, and is a laminate which can stand the process such as metallization in which temperature is increased, and which shows small dimensional change in pattern formation carried out thereafter so that a circuit pattern with a very slight error can be obtained. Further, based on the necessity, the inorganic basal plate can be peeled smoothly and a circuit and a device can precisely be formed on the extremely thin resin film excellent in insulation property, heat resistance and dimensional stability, and therefore the laminate of the present invention is useful for producing a device such as a fine circuit board or a sensor.

DESCRIPTION OF REFERENCE SIGNS (FIG. 1)
1: Glass basal plate
2: Silane coupling agent layer
3: UV light-shielding mask
4: UV non-irradiated parts in silane coupling agent layer
5: UV irradiation parts in silane coupling agent layer
6: Resin layer
7: Resin film on UV irradiation parts in silane coupling agent layer (FIG. 2)
1: Glass basal plate
2: Silane coupling agent layer
3: UV light-shielding mask
4: UV non-irradiated parts in silane coupling agent layer
5: UV irradiation parts in silane coupling agent layer
6: Resin layer
7: Resin film on UV irradiation parts in silane coupling agent layer
8: Circuit (FIG. 3)
1: UV non-irradiated parts in silane coupling agent layer
2: UV irradiation parts in silane coupling agent layer (FIG. 4)
1. Inorganic layer
2. Al
3. Anodization film (Al2O3)
4. First silicon nitride
5. Hydrogenated amorphous silicon
6. Second silicon nitride
7. n-Type amorphous silicon layer
8. Cr/Al layer
9. Gate wiring
10. Signal wire
11. Gate wiring bus line
12. Transparent electrode
A. TFT part
B. Wiring crossing part (FIG. 5)
1. Laminate (inorganic layer)
2. First electrode
3. Light-emitting layer
4. Second electrode
5. Partitioning wall
6. Protection film

The invention claimed is:

1. A method for producing a laminate composed of at least an inorganic layer and a resin layer, the method comprising the following steps (1) to (3):
(1) subjecting at least one surface of the inorganic layer to a coupling agent treatment;
(2) carrying out a patterning treatment for forming good adhesion parts and easily peeling parts with different adhesion peel strength between the inorganic layer and the resin layer, wherein a surface roughness value of the good adhesion parts and a surface roughness value of the easily peeling parts are substantially the same in at least one surface of the inorganic layer subjected to the coupling agent treatment in the step (1); and
(3) forming the resin layer by applying a resin solution or a resin precursor solution to the coupling agent-treated surface of the inorganic layer subjected to the patterning treatment in the step (2) and drying and heating the obtained application solution layer.

2. The method for producing a laminate according to claim 1, wherein the patterning treatment is carried out by subjecting a part of the coupling agent-treated layer to inactivation treatment to form a prescribed pattern.

3. The method for producing a laminate according to claim 2, wherein the inactivation treatment is at least one kind treatment selected from the group consisting of blast treatment, vacuum plasma treatment, atmospheric pressure plasma treatment, corona treatment, active radiation irradiation treatment, active gas treatment, and chemical solution treatment performed by covering or shielding a prescribed portion.

4. The method for producing a laminate according to claim 3, wherein the active radiation treatment is UV irradiation treatment.

5. The method for producing a laminate according to claim 1, wherein the resin layer contains a polyimide obtained by reaction of aromatic diamines and aromatic tetracarboxylic acids.

6. The method for producing a laminate according to claim 1, wherein the resin layer contains a polyimide obtained by reaction of aromatic diamines and aromatic tetracarboxylic acids; 70 mol % or more of the aromatic diamines are aromatic diamines selected from at least one kind of an aromatic diamine having a benzoxazole structure, an aromatic diamine having a diaminodiphenyl ether structure, and an aromatic diamine having a phenylenediamine structure; and 70 mol % or more of the aromatic tetracarboxylic acids are aromatic tetracarboxylic acids selected from at least one kind of pyromellitic acid dianhydride and biphenyltetracarboxylic acid dianhydride.

7. A method for producing a structure having a device formed on the resin layer, the method comprising:
preparing a laminate having an inorganic layer and a resin layer by the method set forth in claim 1;
forming a device on the resin layer of the laminate;
making a cut in the resin layer at an easily peeling part of the laminate; and
peeling the resin layer from the inorganic layer.

8. A method for producing a structure having a device formed on the resin layer, the method comprising:
preparing a laminate having an inorganic layer and a resin layer by the method set forth in claim 3;
forming a device on the resin layer of the laminate;
making a cut in the resin layer at an easily peeling part of the laminate; and
peeling the resin layer from the inorganic layer.

9. A method for producing a structure having a device formed on the resin layer, the method comprising:
preparing a laminate having an inorganic layer and a resin layer by the method set forth in claim 6;
forming a device on the resin layer of the laminate;
making a cut in the resin layer at an easily peeling part of the laminate; and
peeling the resin layer from the inorganic layer.

* * * * *